(12) United States Patent
Kishishita et al.

(10) Patent No.: US 10,847,542 B2
(45) Date of Patent: Nov. 24, 2020

(54) SEMICONDUCTOR INTEGRATED CIRCUIT DEVICE

(71) Applicant: SOCIONEXT INC., Kanagawa (JP)

(72) Inventors: Keisuke Kishishita, Yokohama (JP); Hiroyuki Shimbo, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 35 days.

(21) Appl. No.: 16/182,342

(22) Filed: Nov. 6, 2018

(65) Prior Publication Data

US 2019/0074297 A1 Mar. 7, 2019

Related U.S. Application Data

(63) Continuation of application No. PCT/JP2017/016649, filed on Apr. 27, 2017.

(30) Foreign Application Priority Data

May 6, 2016 (JP) ................................ 2016-093129
Aug. 18, 2016 (JP) ................................ 2016-160862

(51) Int. Cl.
*H01L 27/092* (2006.01)
*H01L 27/02* (2006.01)
(Continued)

(52) U.S. Cl.
CPC ........ *H01L 27/11807* (2013.01); *B82Y 10/00* (2013.01); *H01L 21/822* (2013.01);
(Continued)

(58) Field of Classification Search
CPC ......... H01L 27/11803; H01L 27/11807; H01L 27/1211; H01L 27/0924; H01L 27/0207;
(Continued)

(56) References Cited

U.S. PATENT DOCUMENTS

2011/0057163 A1 3/2011 Liu et al.
2014/0197463 A1* 7/2014 Gan .................. H01L 27/11807
257/204

(Continued)

FOREIGN PATENT DOCUMENTS

JP 2015-019067 A 1/2015
WO 2009/150999 A1 12/2009

(Continued)

OTHER PUBLICATIONS

S. Bangsaruntip, et al. "High performance and higly uniform gate-all-around silicon nanowire MOSFETs with wire size dependent scaling", Electron Device Meeting(IEDM), 2009 IEEE International.

(Continued)

*Primary Examiner* — Natalia A Gondarenko
(74) *Attorney, Agent, or Firm* — McDermott Will & Emery LLP

(57) ABSTRACT

Provided is a layout configuration that helps facilitate manufacturing a semiconductor integrated circuit device including a nanowire FET. A nanowire FET in a standard cell includes Na (where Na is an integer of 2 or more) nanowires extending in an X direction, and a nanowire FET in a standard cell includes Nb (where Nb is an integer of 1 or more and less than Na) nanowires extending in the X direction. At least one of both ends, in the Y direction, of a pad of the nanowire FET is aligned in the X direction with an associated one of both ends, in the Y direction, of a pad of the nanowire FET.

5 Claims, 15 Drawing Sheets

(51) Int. Cl.
  *H01L 29/06*  (2006.01)
  *H01L 29/78*  (2006.01)
  *H01L 27/118*  (2006.01)
  *H01L 29/786*  (2006.01)
  *H01L 23/482*  (2006.01)
  *H01L 29/423*  (2006.01)
  *H01L 21/822*  (2006.01)
  *B82Y 10/00*  (2011.01)
  *H01L 21/8238*  (2006.01)
  *H01L 29/775*  (2006.01)

(52) U.S. Cl.
  CPC ...... *H01L 23/4824* (2013.01); *H01L 27/0207* (2013.01); *H01L 27/092* (2013.01); *H01L 27/0924* (2013.01); *H01L 29/0649* (2013.01); *H01L 29/0673* (2013.01); *H01L 29/42392* (2013.01); *H01L 29/78696* (2013.01); *H01L 21/823807* (2013.01); *H01L 21/823828* (2013.01); *H01L 29/775* (2013.01); *H01L 2027/11864* (2013.01); *H01L 2027/11874* (2013.01)

(58) Field of Classification Search
  CPC ............. H01L 29/0649; H01L 29/0673; H01L 29/42392; H01L 29/775; H01L 29/78696; H01L 2027/11811; H01L 2027/11812; H01L 2027/11862; H01L 2027/11864; H01L 2027/11866; H01L 2027/11874; H01L 29/4238; H01L 29/7858; H01L 29/78654; H01L 29/66439; H01L 23/4824; H01L 21/8232; H01L 21/823431; H01L 21/823456; H01L 21/823807; H01L 21/823821; H01L 21/823842; H01L 21/822; H01L 21/823828; H01L 27/092–27/0928; H01L 27/1104; H01L 27/2463; H01L 27/283; H01L 27/0218; H01L 27/0629; H01L 27/0886; H01L 23/48; H01L 23/481; H01L 23/4952; H01L 23/528; H01L 23/5286; H01L 23/5226; H01L 29/0665; H01L 29/0669; H01L 29/0684; H01L 29/0692; H01L 2027/11881; H01L 2027/1183; H01L 2027/11875; H01L 29/413; H01L 29/66795; H01L 25/042; H01L 25/0655; H01L 25/115; B82Y 10/00

USPC ....... 257/206, 347, 390, 401, 402, 750, 758, 257/E27.098, E21.661

See application file for complete search history.

(56) References Cited

U.S. PATENT DOCUMENTS

| 2015/0014775 | A1 | 1/2015 | Seo et al. |
| 2016/0079358 | A1 | 3/2016 | Doornbos et al. |
| 2016/0190138 | A1* | 6/2016 | Shimbo ............... H01L 27/0886 257/369 |
| 2016/0204107 | A1 | 7/2016 | Shimbo |
| 2017/0033102 | A1* | 2/2017 | Kim .................... H01L 27/0207 |

FOREIGN PATENT DOCUMENTS

| WO | WO-2015033490 A1 * | 3/2015 | ......... H01L 27/0207 |
| WO | 2015/045281 A1 | 4/2015 | |

OTHER PUBLICATIONS

Isaac Lauer, et al. "Si Nanowire CMOS Fabricated with Minimal Deviation from RMG FinFET Technology Showing Record Performance", 2015 Symposium on VLSI Technology Digest of Technical papers.

English translation of International Search Report issued in related International Application No. PCT/JP2017/016649 dated Aug. 1, 2017.

Written Opinion of related International Application No. PCT/JP2017/016649 dated Aug. 1, 2017 (with partial English translation).

* cited by examiner

CELL 101

CELL 102

SEMICONDUCTOR INTEGRATED CIRCUIT DEVICE

CROSS-REFERENCE TO RELATED APPLICATIONS

This is a continuation of International Application No. PCT/JP2017/16649 filed on Apr. 27, 2017, which claims priority to Japanese Patent Application Nos. 2016-093129 and 2016-160862 filed on May 6, 2016 and Aug. 18, 2016, respectively. The entire disclosures of these applications are incorporated by reference herein.

BACKGROUND

The present disclosure relates to a semiconductor integrated circuit device including a standard cell that includes a nanowire field effect transistor (FET).

BACKGROUND ART

A standard cell system is known as a method for forming a semiconductor integrated circuit on a semiconductor substrate. The standard cell system is a method for designing large-scale integration (LSI) chips by preparing basic units (for example, an inverter, a latch, a flip-flop, and a full adder) each with a specific logical function as standard cells in advance, arranging these standard cells on a semiconductor substrate, and connecting the standard cells together via interconnects.

A transistor that is a basic component of an LSI has its gate length reduced (scaled), thereby improving the integration degree, reducing the operating voltage, and improving the operation speed. However, in recent years, excessive scaling causes off-current, which significantly increases consumption power. To solve the problems, three-dimensional transistors the transistor structure of which is changed from a known planar structure to a three-dimensional structure have been actively researched. A nanowire FET is attracting attention as one of the three-dimensional transistors.

S. Bangsaruntip, et al., High Performance and Highly Uniform Gate-All-Around Silicon Nanowire MOSFETs with Wire Size Dependent Scaling, Electron Devices Meeting (IEDM), IEEE International (2009) and Isaac Laucer, et al., Si Nanowire CMOS Fabricated with Minimal Deviation from RMG Fin FET Technology Showing Record Performance, Symposium on VLSI Technology Digest of Technical Papers (2015) each disclose an example of a method for manufacturing a nanowire FET.

SUMMARY

The structure of a standard cell including a nanowire FET and the layout of a semiconductor integrated circuit including the nanowire FET have not been studied yet.

The present disclosure relates to a semiconductor integrated circuit device including a nanowire FET, and provides a layout configuration that helps facilitate manufacturing a semiconductor integrated circuit device.

In a first aspect of the present disclosure, a semiconductor integrated circuit device includes: a first standard cell including a first nanowire field effect transistor (FET); and a second standard cell including a second nanowire FET. The first nanowire FET includes Na (where Na is an integer of 2 or more) first nanowires extending in a first direction, a pair of first pads each provided on an associated one of both ends of the first nanowires in the first direction, and connected to the first nanowires, and a first gate electrode extending in a second direction perpendicular to the first direction, and surrounding a periphery of the first nanowires within a predetermined range of the first nanowires in the first direction. The second nanowire FET includes Nb (where Nb is an integer of 1 or more and less than Na) second nanowires extending in the first direction, a pair of second pads each provided on an associated one of both ends of the second nanowires in the first direction, and connected to the second nanowires, and a second gate electrode extending in the second direction, and surrounding a periphery of the second nanowires within a predetermined range of the second nanowires, in the first direction. At least one of both ends, in the second direction, of the first pad of the first nanowire FET is aligned in the first direction with an associated one of both ends, in the second direction, of the second pads of the second nanowire FET.

According to this aspect, the first nanowire FET of the first standard cell includes Na (where Na is an integer of 2 or more) nanowires extending in the first direction, and the second nanowire FET of the second standard cell includes Nb (where Nb is an integer of 1 or more and less than Na) nanowires extending in the first direction. At least one of both ends of the pads of the first nanowire FET is arranged together with an associated one of both ends of the pads of the second nanowire FET in the second direction perpendicular to the first direction. This allows an end of the pair of pads of the first nanowire FET in the second direction to be aligned in the first direction with an associated end of the pair of pads of the second nanowire FET in the second direction, the first and second nanowire FETs having different numbers of nanowires. This can facilitate manufacturing the semiconductor integrated circuit device, and reduce process-induced variations, thus improving the yield.

In a second aspect of the present disclosure, a semiconductor integrated circuit device includes: a standard cell including a first nanowire field effect transistor (FET) and a second nanowire FET that is a dummy transistor not contributing to a logical operation of a circuit. The first nanowire FET includes a nanowire extending in a first direction, a pair of pads each provided on an associated one of both ends of the nanowire in the first direction, and connected to the nanowire, and a gate electrode extending in a second direction perpendicular to the first direction, and surrounding a periphery of the nanowire within a predetermined range of the nanowire in the first direction. The second nanowire FET includes a dummy nanowire provided between the pads of the first nanowire FET and extending in the first direction, and a dummy gate electrode aligned with the gate electrode of the first nanowire FET, separated from the gate electrode, and surrounding a periphery of the dummy nanowire within a predetermined range of the dummy nanowire in the first direction.

According to this aspect, the standard cell includes the first nanowire FET and the second nanowire FET serving as a dummy transistor not contributing to the logical operation of the circuit. The second nanowire FET includes the dummy nanowire provided between the pads of the first nanowire FET and the dummy electrode aligned with the gate electrode of the first nanowire FET, separated from the gate electrode, and surrounding the dummy nanowire. This allows an end, in the second direction, of the pair of pads of the first nanowire FET to be easily aligned in the first direction with an associated end, in the second direction, of a pad of another nanowire FET. This can facilitate manufacturing the semiconductor integrated circuit device, and reduce process-induced variations, thus improving the yield.

In a third aspect of the present disclosure, a semiconductor integrated circuit device includes: a standard cell including a first nanowire field effect transistor (FET) and a second nanowire FET serving as a dummy transistor not contributing to a logical operation of a circuit. The first nanowire FET includes a nanowire extending in a first direction, a pair of pads each provided on an associated one of both ends of the nanowire in the first direction, and connected to the nanowire, and a gate electrode extending in a second direction perpendicular to the first direction, and surrounding a periphery of the nanowire within a predetermined range of the nanowire in the first direction. The second nanowire FET includes a dummy nanowire extending in the first direction in parallel with the nanowire of the first nanowire FET, and a dummy pad provided on at least one of both ends of the dummy nanowire in the first direction, and connected to the dummy nanowire. The dummy pad is arranged together with the pads of the first nanowire FET in the second direction and separated from the pads.

According to this aspect, the standard cell includes the first nanowire FET and the second nanowire FET serving as a dummy transistor not contributing to the logical operation of the circuit. The second nanowire FET includes the dummy nanowire extending in the first direction in parallel with the nanowire of the first nanowire FET; and the dummy pad provided on at least one of both ends of the dummy nanowire in the first direction, arranged together with the pads of the first nanowire FET in the second direction perpendicular to the first direction, and separated from the pads. This allows an end, in the second direction, of a range including the pad and the dummy pad to be easily aligned in the first direction with that of another nanowire FET. This can facilitate manufacturing the semiconductor integrated circuit device, and reduce process-induced variations, thus improving the yield.

In a fourth aspect of the present disclosure, a semiconductor integrated circuit device includes: a standard cell including a first nanowire field effect transistor (FET) and a second nanowire FET. The first nanowire FET includes Na (where Na is an integer of 2 or more) first nanowires extending in a first direction, a pair of first pads each provided on an associated one of both ends of the first nanowires in the first direction, and connected to the first nanowires, and a first gate electrode extending in a second direction perpendicular to the first direction, and surrounding a periphery of the first nanowires within a predetermined range of the first nanowires in the first direction. The second nanowire FET includes Nb (where Nb is an integer of 1 or more and less than Na) second nanowires extending in the first direction, a pair of second pads each provided on an associated one of both ends of the second nanowires in the first direction, and connected to the second nanowires, and a second gate electrode extending in the second direction, and surrounding a periphery of the second nanowires within a predetermined range of the second nanowires in the first direction. At least one of both ends, in the second direction, of the first pads of the first nanowire FET is aligned in the first direction with an associated one of both ends, in the second direction, of the second pads of the second nanowire FET.

According to this aspect, in the standard cell, the first nanowire FET includes Na (where Na is an integer of 2 or more) nanowires extending in a first direction, and the second nanowire FET includes Nb (where Nb is an integer of 1 or more and less than Na) nanowire extending in the first direction. At least one of both ends, in the second direction perpendicular to the first direction, of the pads of the first nanowire FET is aligned in the first direction with an associated one of both ends, in the second direction, of the pads of the second nanowire FET. This allows an end, in the second direction, of the pair of pads of the first nanowire FET to be aligned in the first direction with an associated end, in the second direction, of the pair of pads of the second nanowire FET, the first and second nanowire FETs having different numbers of nanowires. This can facilitate manufacturing the semiconductor integrated circuit device, and reduce process-induced variations, thus improving the yield.

The present disclosure can facilitate manufacturing a semiconductor integrated circuit device including a nanowire FET, and reduce process-induced variations, thus improving the yield.

DETAILED DESCRIPTION

Embodiments will now be described with reference to the accompanying drawings. In the following embodiments, a semiconductor integrated circuit device includes a plurality of standard cells, and at least some of the standard cells include a nanowire field effect transistor (FET).

Figure 14:
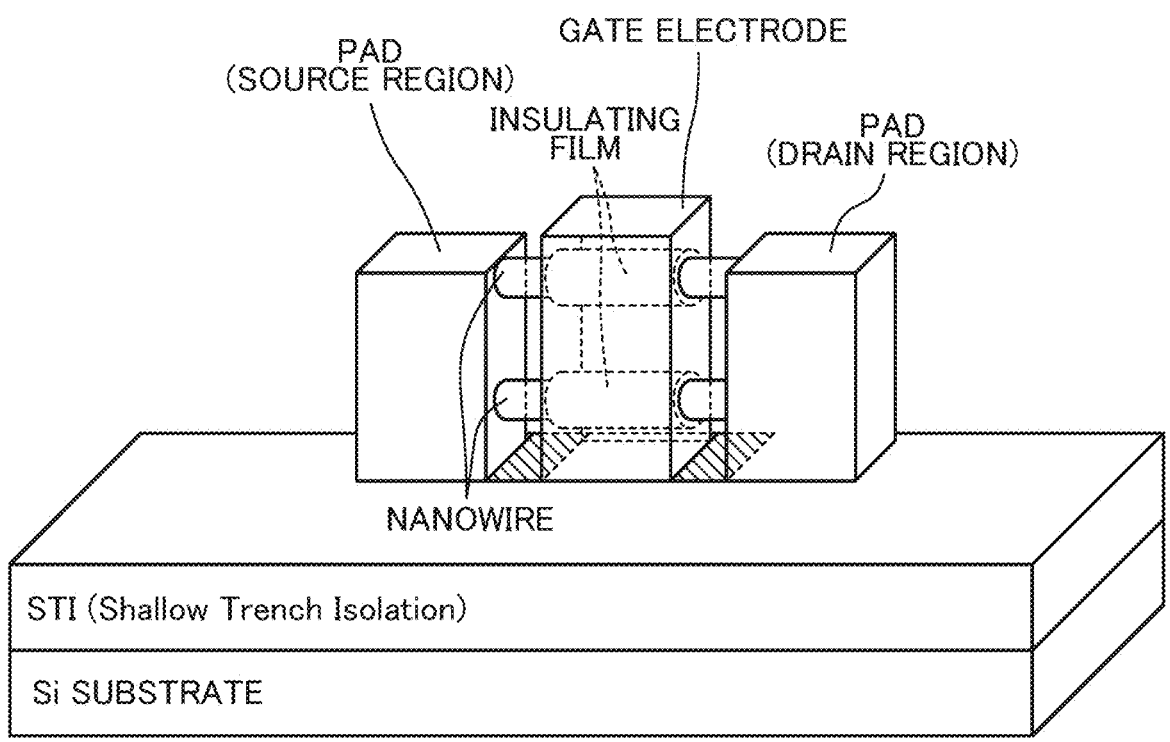
FIG. 14 is a schematic view illustrating a basic structure of a nanowire FET.

FIG. 14 is a schematic view illustrating an example of a basic structure of the nanowire FET (may also be referred to as a "Gate All Around (GAA) structure"). The nanowire FET is a FET including a thin wire (nanowire) through which an electric current flows. For example, the nanowire is formed of silicon. As illustrated in FIG. 14, the nanowire is formed above a substrate to extend in a horizontal direction, i.e., in parallel with the substrate, and both ends of the nanowire are connected to structures serving as a source region and a drain region of the nanowire FET. The structures connected to both ends of the nanowire of the nanowire FET and serving as a source region and a drain region of the nanowire FET as used herein are referred to as pads. In FIG. 14, a shallow trench isolation (STI) is formed on a silicon substrate, but (hatched) portions of the silicon substrate are exposed under the nanowire. In reality, the hatched portions may be covered with a thermal oxidation film and any other film. However, in FIG. 14, such a film is not shown for simplicity.

For example, a nanowire is surrounded by a gate electrode made of polysilicon with an insulating film such as a silicon oxide film interposed therebetween. The pads and the gate electrode are formed on the substrate surface. In this structure, an upper portion, both end portions, and a lower portion of the channel region of the nanowire are all surrounded by the gate electrode. Consequently, an electric field is uniformly applied to the channel region, thereby improving the switching characteristics of the FET.

A portion of each of the pads at least connected to the nanowire serves as a source/drain region. However, a portion of the pad lower than the portion connected to the nanowire does not necessarily have to be the source/drain region. Moreover, a portion of the nanowire (portion not surrounded by the gate electrode) may be the source/drain region.

Furthermore, in FIG. 14, two of the nanowires are disposed in a vertical direction, i.e., a direction perpendicular to the substrate. However, the number of the nanowires disposed in the vertical direction is not limited to two, and may also be one, or three or more nanowires may be arranged side by side in the vertical direction. Furthermore, in FIG. 14, the upper end of the uppermost nanowire and the upper ends of the pads are flush with each other. However, there is no need to align these upper ends, and the upper ends of the pads may be higher than the upper end of the uppermost nanowire.

Figure 15:
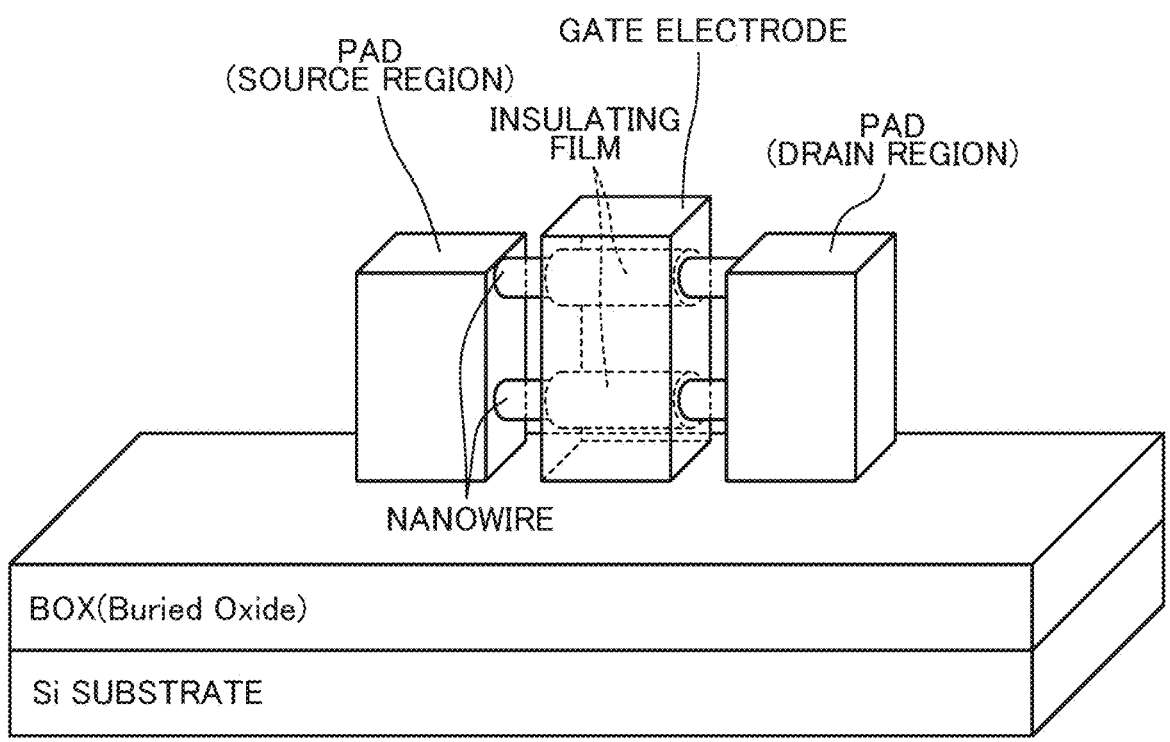
FIG. 15 is a schematic view illustrating a basic structure of the nanowire FET.

Moreover, as illustrated in FIG. 15, a buried oxide (BOX) is formed on the upper surface of the substrate, and a nanowire FET may be formed on the BOX.

First Embodiment

Figure 1:
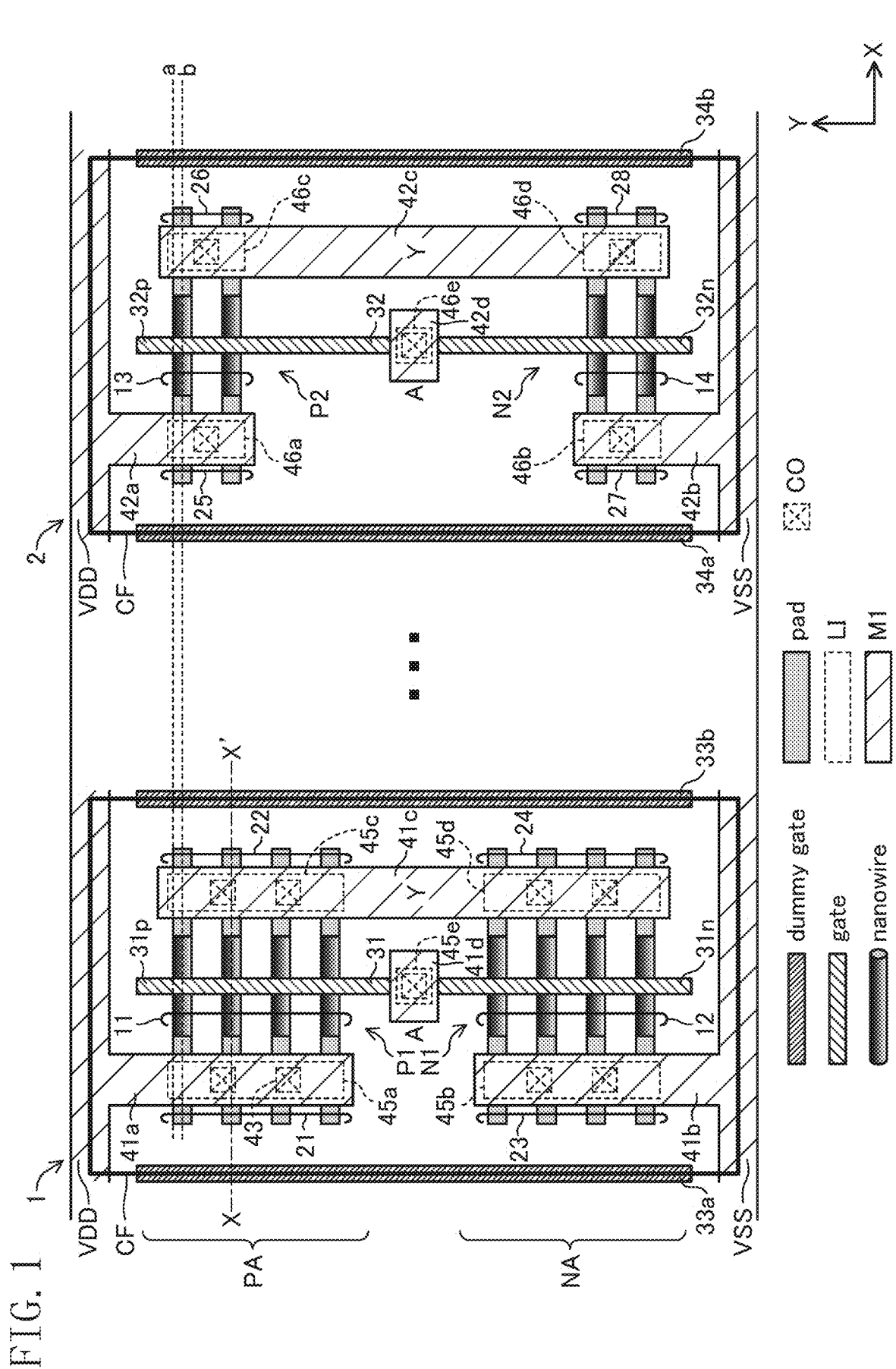
FIG. 1 is a plan view illustrating an example of a layout configuration of a semiconductor integrated circuit device according to a first embodiment.

FIG. 1 is a plan view illustrating an example of a layout configuration of a semiconductor integrated circuit device according to a first embodiment. Standard cells 1 and 2 illustrated in FIG. 1 each constitute an inverter having an input A and an output Y, using nanowire FETs. In FIG. 1, the lateral direction in the drawing is an X direction (corresponds to a first direction), and the longitudinal direction in the drawing is a Y direction (corresponds to a second direction). The same applies to the following layout plan views. In FIG. 1, the standard cells 1 and 2 are disposed in the same cell row extending in the X direction.

The standard cells 1 and 2 include a P-type transistor region PA and an N-type transistor region NA arranged side by side in the Y direction. Each of the standard cells 1 and 2 includes two nanowire FETs. In other words, in the standard cell 1, a P-type nanowire FET P1 is provided in the P-type transistor region PA, and an N-type nanowire FET N1 is provided in the N-type transistor region NA. Moreover, in the standard cell 2, a P-type nanowire FET P2 is provided in the P-type transistor region PA, and an N-type nanowire FET N2 is provided in the N-type transistor region NA.

In the standard cell 1, the nanowire FETs P1, N1 each include Na (where Na is an integer of two or more) nanowires 11, 12 that extends in the X direction and that are provided in parallel. In this example, four nanowires 11 are arranged side by side in the Y direction, and so are four nanowires 12. Moreover, two nanowires 11 are arranged in the vertical direction, i.e., the direction perpendicular to the substrate, and so are two nanowires 12. The total number of the nanowires 11 is eight, and the total number of the nanowires 12 is eight (Na=8). In the standard cell 2, the nanowire FETs P2, N2 each include Nb (where Nb is an integer of one or more and less than Na) nanowires 13, 14 that extends in the X direction and that are provided in parallel. In this example, two nanowires 13 are arranged side by side in the Y direction, and so are two nanowires 14. Moreover, two nanowires 13 are arranged in the vertical direction, i.e., the direction perpendicular to the substrate, and so are two nanowires 14. The total number of the nanowires 13 is four, and the total number of the nanowires 14 is also four (Nb=4). The nanowires 11, 12, 13, and 14 are formed in a cylinder shape, extends above the substrate in the horizontal direction, i.e., in parallel with the substrate, and are made of silicon, for example. The standard cell 1 includes a pair of pads 21 and 22 connected to the nanowires 11, and a pair of pads 23 and 24 connected to the nanowires 12. The standard cell 2 includes a pair of pads 25 and 26 connected to the nanowires 13, and a pair of pads 27 and 28 connected to the nanowires 14. The pads 21, 22, 25, and 26 each have a portion at least connected to the nanowire 11 or 13, the portion being doped with P-type impurities. The pads 21, 22, 25, and 26 serve as a source region or a drain region of the nanowire FETs P1 and P2. The pads 23, 24, 27, and 28 each have a portion at least connected to the nanowire 12 or 14, the portion being doped with N-type impurities. The pads 23, 24, 27, and 28 each serve as a source region or a drain region of an associated one of the nanowire FETs N1 and N2.

Moreover, in this example, each of the pads 21, 22, 23, and 24 is divided into four parts spaced apart from one another in the Y direction. The four parts into which the pad 21 has been divided are connected to the respective four nanowires 11 provided in the Y direction. The four parts into which the pad 22 has been divided are connected to the respective four nanowires 11 provided in the Y direction. The four parts into which the pad 23 has been divided are connected to the respective four nanowires 12 provided in the Y direction. The four parts into which the pad 24 has been divided are connected to the respective four nanowires 12 provided in the Y direction. Furthermore, in this example, each of the pads 25, 26, 27, and 28 is divided into two parts spaced apart from one another in the Y direction. The two parts into which the pad 25 has been divided are connected to the respective two nanowires 13 provided in the Y direction. The two parts into which the pad 26 has been divided are connected to the respective two nanowires 13 provided in the Y direction. The two parts into which the pad 27 has been divided are connected to the respective two nanowires 14 provided in the Y direction. The two parts into which the pad 28 has been divided are connected to the respective two nanowires 14 provided in the Y direction.

The standard cell 1 includes a gate interconnect 31 extending linearly in the Y direction, and the standard cell 2 includes a gate interconnect 32 extending linearly in the Y direction. The gate interconnect 31 includes a gate electrode 31p of the nanowire FET P1 and a gate electrode 31n of the nanowire FET N1 which are connected together. The gate interconnect 31 surrounds a periphery of the nanowires 11 and 12 within a predetermined range of the nanowires 11 and 12 in the X direction. The gate interconnect 32 includes a gate electrode 32p of the nanowire FET P2 and a gate electrode 32n of the nanowire FET N2 which are connected together. The gate interconnect 32 surrounds a periphery of the nanowires 13 and 14 within a predetermined range of the nanowires 13 and 14 in the X direction. Moreover, the standard cell 1 includes dummy gate interconnects 33a and 33b extending in the Y direction and disposed on the respective sides of its cell frame CF. The standard cell 2 includes dummy gate interconnects 34a and 34b extending in the Y direction and disposed on the respective sides of its cell frame CF.

A metal interconnect layer M1 is formed above the nanowire FETs P1, P2, N1, and N2. The metal interconnect layer M1 includes an interconnect VDD serving as a first power supply interconnect supplying a power supply potential and disposed at the upper side of the cell frame CF, and an interconnect VSS serving as a second power supply interconnect supplying a ground potential and disposed at the lower side of the cell frame CF. Moreover, the metal interconnect layer M1 includes interconnects 41a to 41d formed in the standard cell 1, and interconnects 42a to 42d formed in the standard cell 2.

In the standard cell 1, the interconnect 41a is formed to extend downward in the Y direction from the interconnect VDD, and is connected to the pad 21 through a local interconnect 45a. The interconnect 41b is formed to extend upward in the Y direction from the interconnect VSS, and is connected to the pad 23 through a local interconnect 45b. The interconnect 41c connects the pads 22 and 24 together, and is connected to the pad 22 through a local interconnect 45c and connected to the pad 24 through a local interconnect 45d. The interconnect 41d is connected to the gate interconnect 31 through a local interconnect 45e. The interconnects 41c and 41d respectively correspond to the output Y and the input A of the inverter formed by the standard cell 1.

In the standard cell 2, the interconnect 42a is formed to extend downward in the Y direction from the interconnect VDD, and is connected to the pad 25 through a local interconnect 46a. The interconnect 42b is formed to extend upward in the Y direction from the interconnect VSS, and is connected to the pad 27 through a local interconnect 46b. The interconnect 42c connects the pads 26 and 28 together, and is connected to the pad 26 through a local interconnect 46c and connected to the pad 28 through a local interconnect 46d. The interconnect 42d is connected to the gate interconnect 32 via a local interconnect 46e. The interconnects 42c and 42d respectively correspond to the output Y and the input A of the inverter formed by the standard cell 2.

Figure 2:
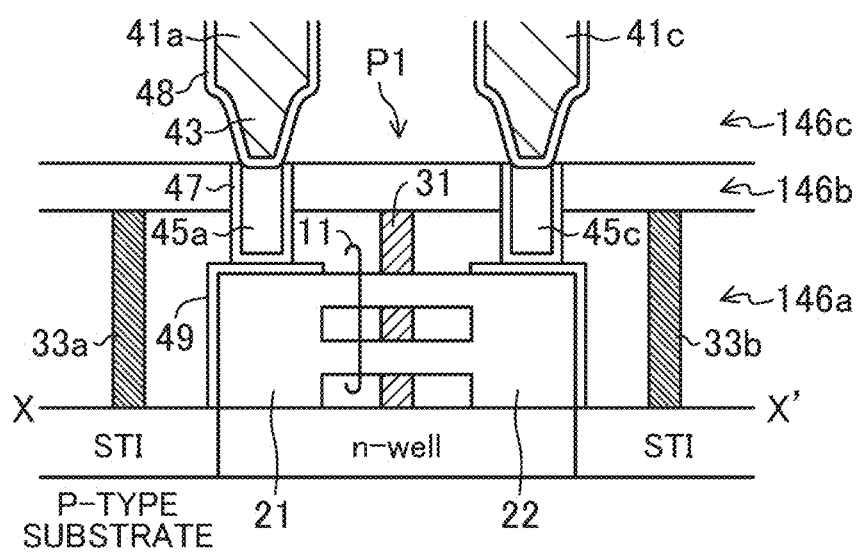
FIG. 2 is a cross-sectional view of the layout configuration in FIG. 1.

FIG. 2 is a cross-sectional view taken along the line X-X' of the layout configuration in FIG. 1. As illustrated in FIG. 2, the interconnects 41a and 41c of the metal interconnect layer M1 are respectively connected to the local interconnects 45a and 45c via a contact 43. The contact 43 is formed by a dual damascene process with the interconnects 41a and 41c of the metal interconnect layer M1. The contact 43 may also be formed separately from the interconnects 41a and 41c of the metal interconnect layer M1. Moreover, for example, the interconnects 41a and 41c of the metal interconnect layer M1 are made of Cu, and has a surface on which a barrier metal 48 including tantalum or tantalum nitride, for example, is formed. For example, the local interconnects 45a and 45c are made of tungsten, and has a surface on which a glue film 47 including titanium or titanium nitride, for example, is formed. The local interconnects 45a and 45c may also be formed of cobalt. In this case, the glue film 47 does not have to be formed. Furthermore, for example, a silicide film 49 made of nickel, cobalt, or any other suitable material is formed on the surface of each of the pads 21 and 22.

For example, the interlayer insulating films 146a and 146b are silicon oxide films. For example, the interlayer insulating film 146c is a low dielectric film such as SiOC and a porous film. The interlayer insulating film 146c may also have a laminated structure of two or more layers.

For example, the gate electrode 31 is formed of polysilicon. The gate electrode 31 may also be formed of a material including metal such as titanium nitride. Moreover, for example, a gate insulating film is a silicon oxide film, and for example, is formed by a thermal oxidation method. The gate insulating film may also be made of oxide of hafnium, zirconium, lanthanum, yttrium, aluminum, titanium, or tantalum.

As is evident from the cross-sectional view in FIG. 2, the lower surfaces of the pads 21 to 28 are lower than the lower surfaces of the nanowires 11, 12, 13, and 14. Moreover, the upper surfaces of the nanowires 11, 12, 13, and 14 are flush with the upper surfaces of the pads 21 to 28. The gate electrodes 31p, 32p, 31n, and 32n each surround an associated one of the nanowires 11, 12, 13, and 14. In other words, an upper surface, both sides, and a lower surface of the channel region of each of the nanowires 11, 12, 13, and 14 are all surrounded by an associated one of the gate electrodes 31p, 32p, 31n, and 32n with an insulating film interposed therebetween. The upper surfaces of the nanowires 11, 12, 13, and 14 may be lower than the upper surfaces of the pads 21 to 28.

A buried oxide (BOX) may also be formed on the upper surface of the substrate.

In this example, the metal interconnects 41a to 41d are each connected to an associated one or ones of the pads 21, 22, 23, and 24 and the gate interconnect 31 through an associated one or ones of the local interconnects 45a, 45b, 45c, 45d, and 45e and the contacts 43; and the metal interconnects 42a to 42d are each connected to an associated one or ones of the pads 25, 26, 27, and 28 and the gate interconnect 32 through an associated one or ones of the local interconnects 46a, 46b, 46c, 46d, and 46e and the contacts 43. However, the metal interconnects may be each connected to an associated one or ones of the pads and the gate interconnect only via the associated local interconnect (s) without going through the contact, or only via the associated contact without going through the associated local interconnect(s).

The layout configuration of FIG. 1 has the following characteristics.

In the P-type transistor region PA, the nanowire FET P1 in the standard cell 1 is compared with the nanowire FET P2 in the standard cell 2. The ends, in the Y direction, of the pads 21 and 22 of the nanowire FET P1 closer to the interconnect VDD (the upper ends in the drawing) are aligned in the X direction with the ends, in the Y direction, of the pads 25 and 26 of the nanowire FET P2 closer to the interconnect VDD (the upper ends in the drawing) (the broken line a in FIG. 1). Moreover, one of the nanowires 11 of the nanowire FET P1 and one of the nanowires 13 of the nanowire FET P2 both closest to the upper end of the associated pad are aligned in the X direction with each other (the broken line b in FIG. 1). In this example, the two nanowires 13 of the nanowire FET P2 are aligned in the X direction with two upper ones of the nanowires 11 of the nanowire FET P1 in the drawing.

The same applies to the N-type transistor region NA. The ends, in the Y direction, of the pads 23 and 24 of the nanowire FET N1 closer to the interconnect VSS (the lower ends in the drawing) are aligned in the X direction with the ends, in the Y direction, of the pads 27 and 28 of the nanowire FET N2 closer to the interconnect VSS (the lower ends in the drawing). Moreover, one of the nanowires 12 of the nanowire FET N1 and one of the nanowires 14 of the nanowire FET N2 both closest to the lower end of the associated pad are aligned in the X direction with each other. In this example, the two nanowires 14 of the nanowire FET N2 are respectively aligned in the X direction with two upper ones of the nanowires 12 of the nanowire FET N1 in the drawing.

With the configuration of FIG. 1, one end, in the Y direction, of each of the pads 21 and 22 of the nanowire FET P1 including Na nanowires is aligned in the X direction with one end, in the Y direction, of each of the pads 25 and 26 of the nanowire FET P2 including Nb (<Na) nanowires. This allows both ends, in the Y direction, of the pad of the nanowire FET P1 to be aligned in the X direction with both ends, in the Y direction, of the pad of the nanowire FET P2, respectively, the nanowire FETs P1 and P2 having different numbers of nanowires. Similarly, both ends, in the Y direction, of the pad of the nanowire FET N1 can be aligned in the X direction with both ends, in the Y direction, of the pad of the nanowire FET N2, respectively, the nanowire FETs N1 and N2 having different numbers of nanowires. This configuration can facilitate manufacturing the semiconductor integrated circuit device, and reduce process-induced variations, thus improving the yield.

Another Example 1

Figure 3:
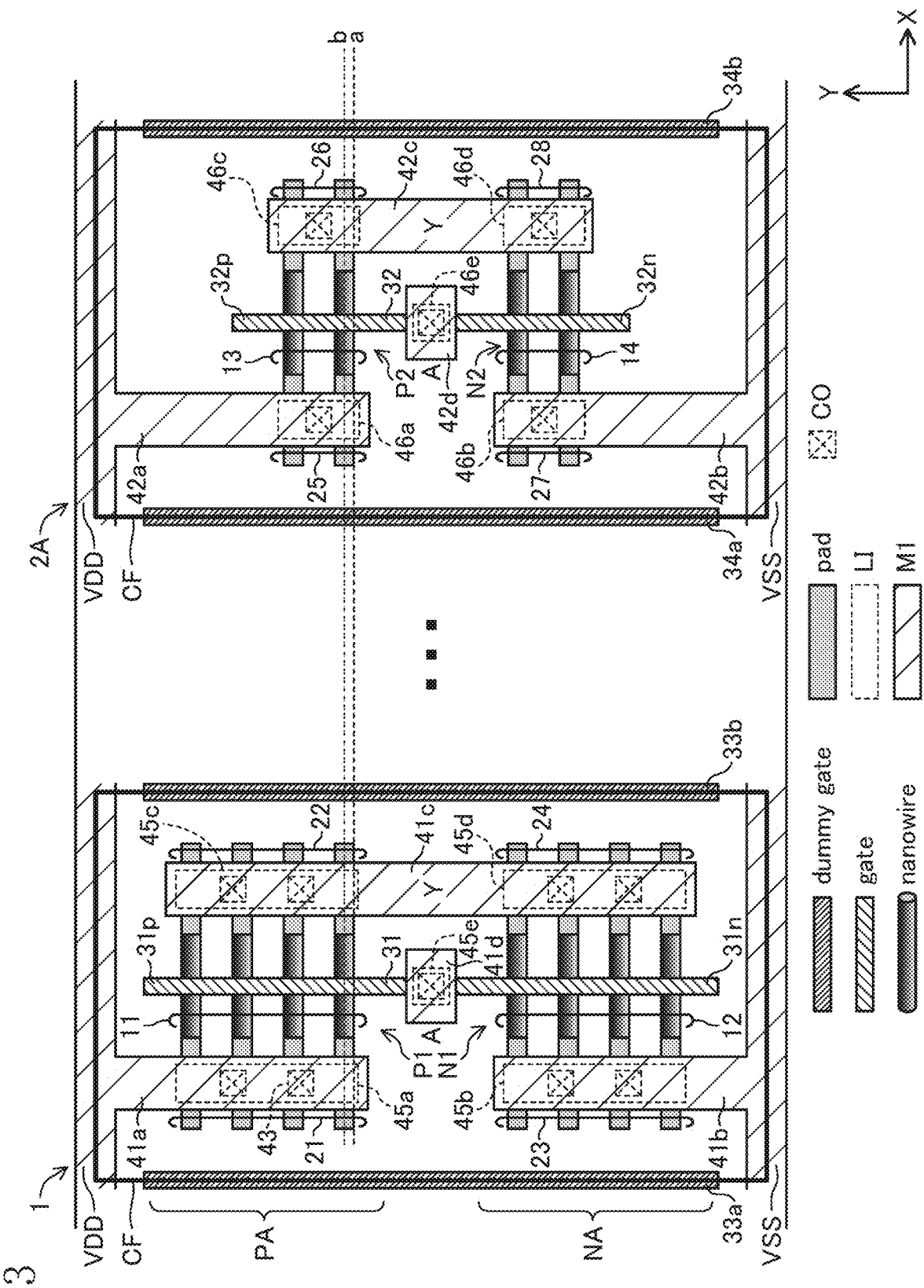
FIG. 3 is a plan view illustrating another example of the layout configuration of the semiconductor integrated circuit device according to the first embodiment.

FIG. 3 is a plan view illustrating another example of the layout configuration of the semiconductor integrated circuit device according to the present embodiment. The layout configuration in FIG. 3 is basically similar to that in FIG. 1, the same reference numerals denote equivalent components, and the detailed descriptions thereof may be omitted here. In FIG. 3, the layout of a standard cell 2A is slightly different from that of the standard cell 2 in FIG. 1.

The layout configuration of FIG. 3 has the following characteristics. Specifically, in the P-type transistor region PA, ends, in the Y direction, of the pads 21 and 22 of the nanowire FET P1 further from the interconnect VDD (the lower ends in the drawing) are aligned in the X direction with ends, in the Y direction, of the pads 25 and 26 of the nanowire FET P2 further from the interconnect VDD (the lower ends in the drawing) (the broken line a in FIG. 3). Moreover, one of the nanowires 11 of the nanowire FET P1 and one of the nanowires 13 of the nanowire FET P2 both closest to the lower end of the associated pad are aligned in the X direction with each other (the broken line b in FIG. 1). In this example, the two nanowires 13 of the nanowire FET P2 are respectively aligned in the X direction with two upper ones of the nanowires 11 of the nanowire FET P1 in the drawing.

The same applies to the N-type transistor region. The ends, in the Y direction, of the pads 23 and 24 of the nanowire FET N1 further from the interconnect VSS (the upper ends in the drawing) are aligned in the X direction with the ends, in the Y direction, of the pads 27 and 28 of the nanowire FET N2 further from the interconnect VSS (the upper ends in the drawing). Moreover, one of the nanowires 12 of the nanowire FET N1 and one of the nanowires 14 of the nanowire FET N2 both closest to the upper end of the associated pad are aligned in the X direction with each other. In this example, the two nanowires 14 of the nanowire FET N2 are respectively aligned in the X direction with two upper ones of the nanowires 12 of the nanowire FET N1 in the drawing.

With the configuration of FIG. 3, just like the configuration of FIG. 1, both ends, in the Y direction, of the pad of the nanowire FET P1 can be aligned in the X direction with both ends, in the Y direction, of the pad of the nanowire FET P2, respectively, the nanowire FETs P1 and P2 having different numbers of nanowires. Similarly, both ends, in the Y direction, of the pad of the nanowire FET N1 can be aligned in the X direction with both ends, in the Y direction, of the pad of the nanowire FET N2, respectively, the nanowire FETs N1 and N2 having different numbers of nanowires. This can facilitate manufacturing the semiconductor integrated circuit device, and reduce process-induced variations, thus improving the yield.

In the standard cell 2A, the gate interconnect 32 is shorter than the gate interconnect 31 of the standard cell 1. In other words, the gate electrode 32$p$ of the nanowire FET P2 is shorter than the gate electrode 31$p$ of the nanowire FET P1, and the gate electrode 32$n$ of the nanowire FET N2 is shorter than the gate electrode 31$n$ of the nanowire FET N1. Consequently, the gate capacitance is reduced. Note that the length of the gate interconnect 32 may be the same as that of the gate interconnect 31. Moreover, in the standard cell 2A, the interconnect 42$c$ corresponding to the output Y is shorter than the interconnect 41$c$ corresponding to the output Y of the standard cell 1. Consequently, the wiring capacitance is reduced.

Another Example 2

Figure 4:
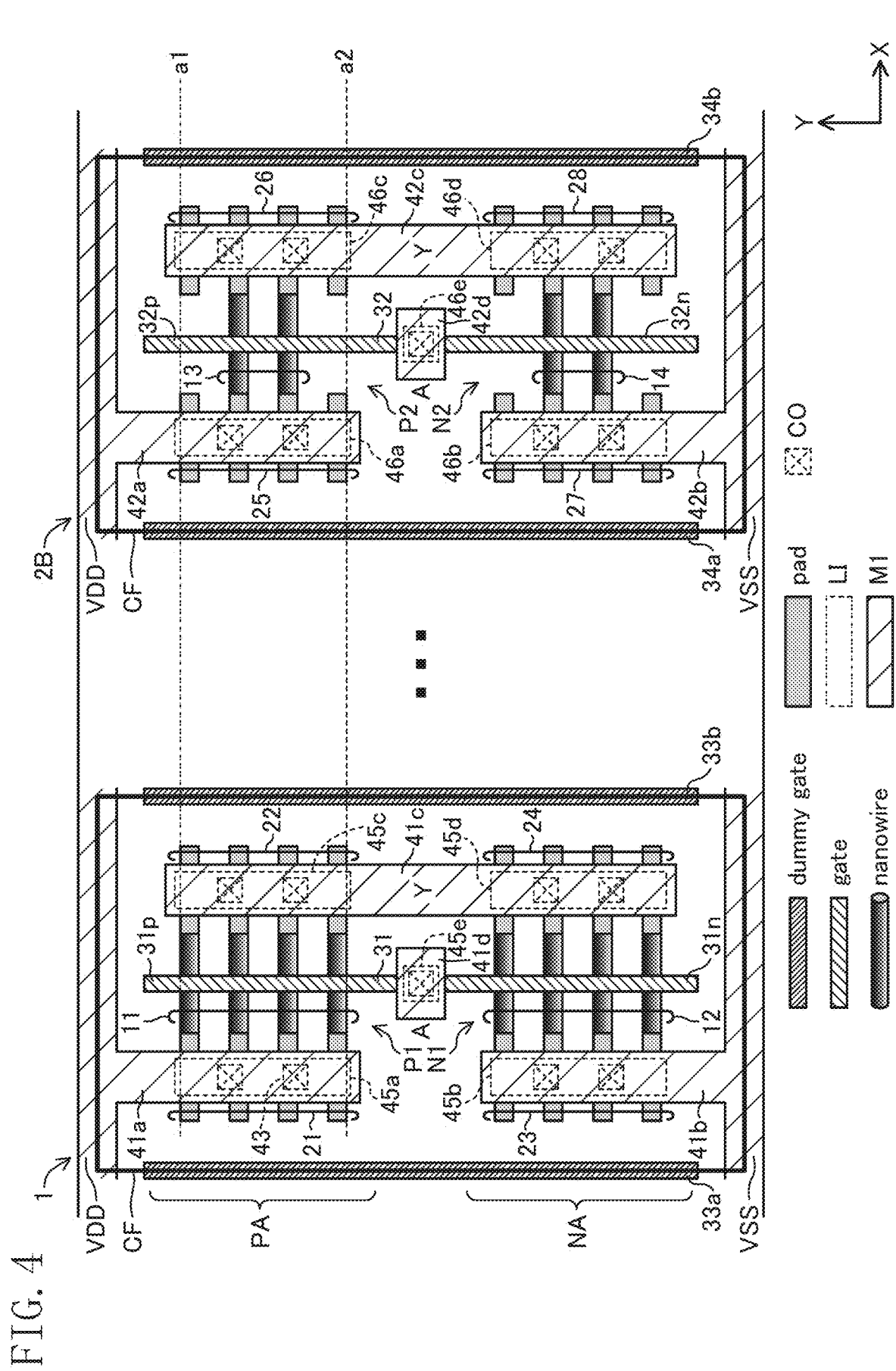
FIG. 4 is a plan view illustrating still another example of the layout configuration of the semiconductor integrated circuit device according to the first embodiment.

FIG. 4 is a plan view illustrating still another example of the layout configuration of the semiconductor integrated circuit device according to the present embodiment. The layout configuration in FIG. 4 is basically similar to that in FIG. 1, the same reference numerals denote equivalent components, and the detailed descriptions thereof may be omitted here. In FIG. 4, the layout of a standard cell 2B is slightly different from that of the standard cell 2 in FIG. 1.

The layout configuration of FIG. 4 has the following characteristics. Specifically, in the P-type transistor region PA, one end, in the Y direction, of each of the pads 21 and 22 of the nanowire FET P1 is aligned in the X direction with one end of the pad 25, 26 of the nanowire FET P2, and the other end, in the Y direction, of the pad 21, 22 of the nanowire FET P1 is aligned in the X direction with the other end, in the Y direction, of the pad 25, 26 of the nanowire FET P2 (the broken lines a1 and a2 in FIG. 4). In other words, the pads 21 and 22 and the pads 25 and 26 are arranged in the same range in the Y direction. Moreover, in this example, the two nanowires 13 are respectively aligned in the X direction with two central ones of the nanowires 11 of the nanowire FET P1. In other words, in the nanowire FET P2, in the Y direction, the center position of the arrangement range of the nanowires 13 and the center position of the arrangement range of the pads 25 and 26 corresponds to each other.

The same applies to the N-type transistor region. Both ends, in the Y direction, of each of the pads 23 and 24 of the nanowire FET N1 are aligned in the X direction with both ends, in the Y direction, of each of the pads 27 and 28 of the nanowire FET N2, respectively. In other words, the pads 23 and 24 and the pads 27 and 28 are arranged in the same range in the Y direction. Moreover, in this example, the two nanowires 14 of the nanowire FET N2 are respectively aligned in the X direction with two central ones of the nanowires 12 of the nanowire FET N1. In other words, in the nanowire FET N2, in the Y direction, the center position of the arrangement range of the nanowires 14 and the center position of the arrangement range of the pads 27 and 28 correspond to each other.

With the configuration of FIG. 4, just like the configuration of FIG. 1, both ends, in the Y direction, of the pad of the nanowire FET P1 can be aligned in the X direction with both ends of the pad of the nanowire FET P2, respectively, the nanowire FETs P1 and P2 having different numbers of nanowires. Similarly, both ends, in the Y direction, of the pad of the nanowire FET N1 can be aligned in the X direction with both ends, in the Y direction, of the pad of the nanowire FET N2, respectively, the nanowire FETs N1 and N2 having different numbers of nanowires. This can facilitate manufacturing the semiconductor integrated circuit device, and reduce process-induced variations, thus improving the yield.

Another Example 3

Figure 5:
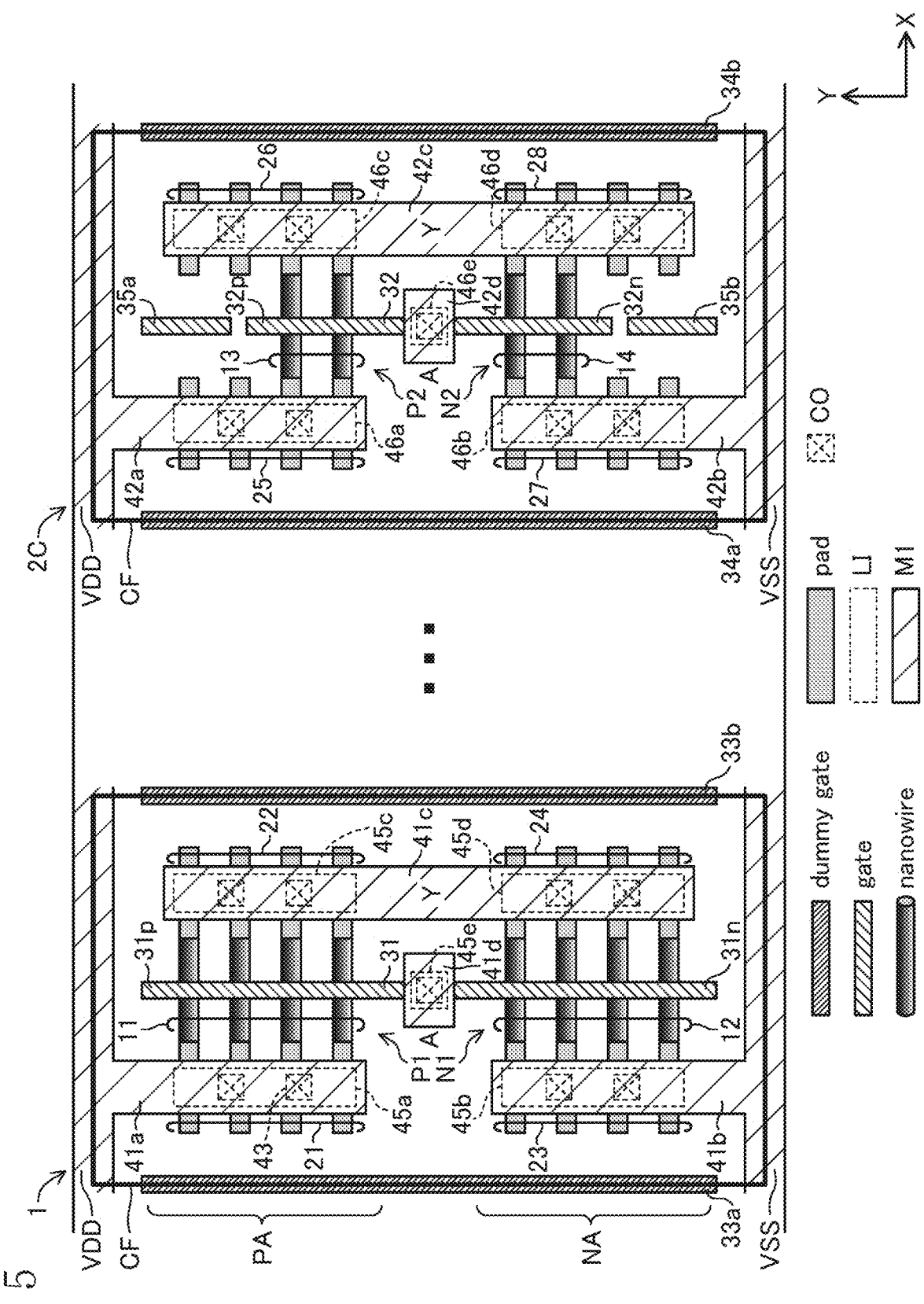
FIG. 5 is a plan view illustrating yet another example of the layout configuration of the semiconductor integrated circuit device according to the first embodiment.

FIG. 5 is a plan view illustrating yet another example of the layout configuration of the semiconductor integrated circuit device according to the present embodiment. The layout configuration in FIG. 5 is basically similar to that in FIG. 1, the same reference numerals denote equivalent components, and the detailed descriptions thereof may be omitted here. In FIG. 5, the layout of a standard cell 2C is slightly different from that of the standard cell 2 in FIG. 1.

The layout configuration of FIG. 5 has the following characteristics. Specifically, in the P-type transistor region PA, one end, in the Y direction, of each of the pads 21 and 22 of the nanowire FET P1 is aligned in the X direction with one end, in the Y direction, of each of the pads 25 and 26 of the nanowire FET P2, and the other end, in the Y direction, of the pad 21, 22 of the nanowire FET P1 is aligned in the X direction with the other end, in the Y direction, of the pad 25, 26 of the nanowire FET P2. In other words, the pads 21 and 22 and the pads 25 and 26 are arranged in the same range in the Y direction. Also in the N-type transistor region, one end, in the Y direction, of each of the pads 23 and 24 of the nanowire FET N1 is aligned in the X direction with one end, in the Y direction, of each of the pads 27 and 28 of the nanowire FET N2, and the other end, in the Y direction, of the pad 23, 24 of the nanowire FET N1 is aligned in the X direction with the other end, in the Y direction, of the pad 25, 26 of the nanowire FET N2. In other words, the pads 23 and 24 and the pads 27 and 28 are arranged in the same range in the Y direction. These features are the same as those in the configuration in FIG. 4.

In the layout configuration of FIG. 5, the nanowire FET P2 is configured such that the arrangement range of the nanowires 13 is localized on one side of the nanowire FET P2 in the Y direction with respect to the arrangement range of the pads 25 and 26. In FIG. 5, the nanowires 13 are localized on the lower side of the drawing with respect to the arrangement range of the pads 25 and 26. The two nanowires 13 are respectively aligned in the X direction with two lower ones of the nanowires 11 of the nanowire FET P1 in the drawing. Moreover, the nanowire FET N2 is configured such that the arrangement range of the nanowires 14 is localized on one side of the nanowire FET N2 in the Y direction with respect to the arrangement range of the pads 27 and 28. In FIG. 5, the nanowires 14 are localized on the upper side of the drawing with respect the arrangement range of the pads 27 and 28 to the upper side of the drawing. The two nanowires 14 are respectively aligned with two upper ones of the nanowires 12 of the nanowire FET N1 in the drawing.

Furthermore, the nanowire FET P2 includes a dummy gate electrode 35a. The dummy gate electrode 35a is disposed between the pads 25 and 26 so as to be aligned with the gate electrode 32p. The dummy gate electrode 35a is separated from the gate electrode 32p. Similarly, the nanowire FET N2 includes a dummy gate electrode 35b. The dummy gate electrode 35b is disposed between the pads 27 and 28 so as to be aligned with the gate electrode 32n. The dummy gate electrode 35b is separated from the gate electrode 32n.

With the configuration of FIG. 5, just like the configuration of FIG. 1, both ends, in the Y direction, of the pad of the nanowire FET P1 can be aligned in the X direction with both ends, in the Y direction, of the pad of the nanowire FET P2, respectively, the nanowire FETs P1 and P2 having different numbers of nanowires. Similarly, both ends, in the Y direction, of the pad of the nanowire FET N1 can be aligned in the X direction with both ends, in the Y direction, of the pad of the nanowire FET N2, respectively, the nanowire FETs N1 and N2 having different numbers of nanowires. This can facilitate manufacturing the semiconductor integrated circuit device, and reduce process-induced variations, thus improving the yield.

In the layout configuration of FIG. 5, the dummy gate electrodes 35a and 35b do not have to be disposed, and only one of the dummy gate electrodes 35a and 35b may be disposed.

In the present embodiment, the nanowire FETs P1 and N1 each include eight nanowires in total, four in the plan view and two in the vertical direction, and the nanowire FETs P2 and N2 each include four nanowires in total, two in the plan view and two in the vertical direction. However, the number of nanowires is merely an example of the present disclosure. The P-type nanowire FET and the N-type nanowire FET may also include different numbers of nanowires.

Moreover, in the present embodiment, the nanowires 13 of the nanowire FET P2 are aligned in the X direction with the associated nanowires 11 of the nanowire FET P1. However, the nanowires 13 do not have to be aligned with the associated nanowires 11. Furthermore, in the present embodiment, the nanowires 14 of the nanowire FET N2 are aligned in the X direction with the associated nanowires 12 of the nanowire FET N1. However, the nanowires 14 do not have to be aligned with the associated nanowires 12.

Second Embodiment

Figure 6:
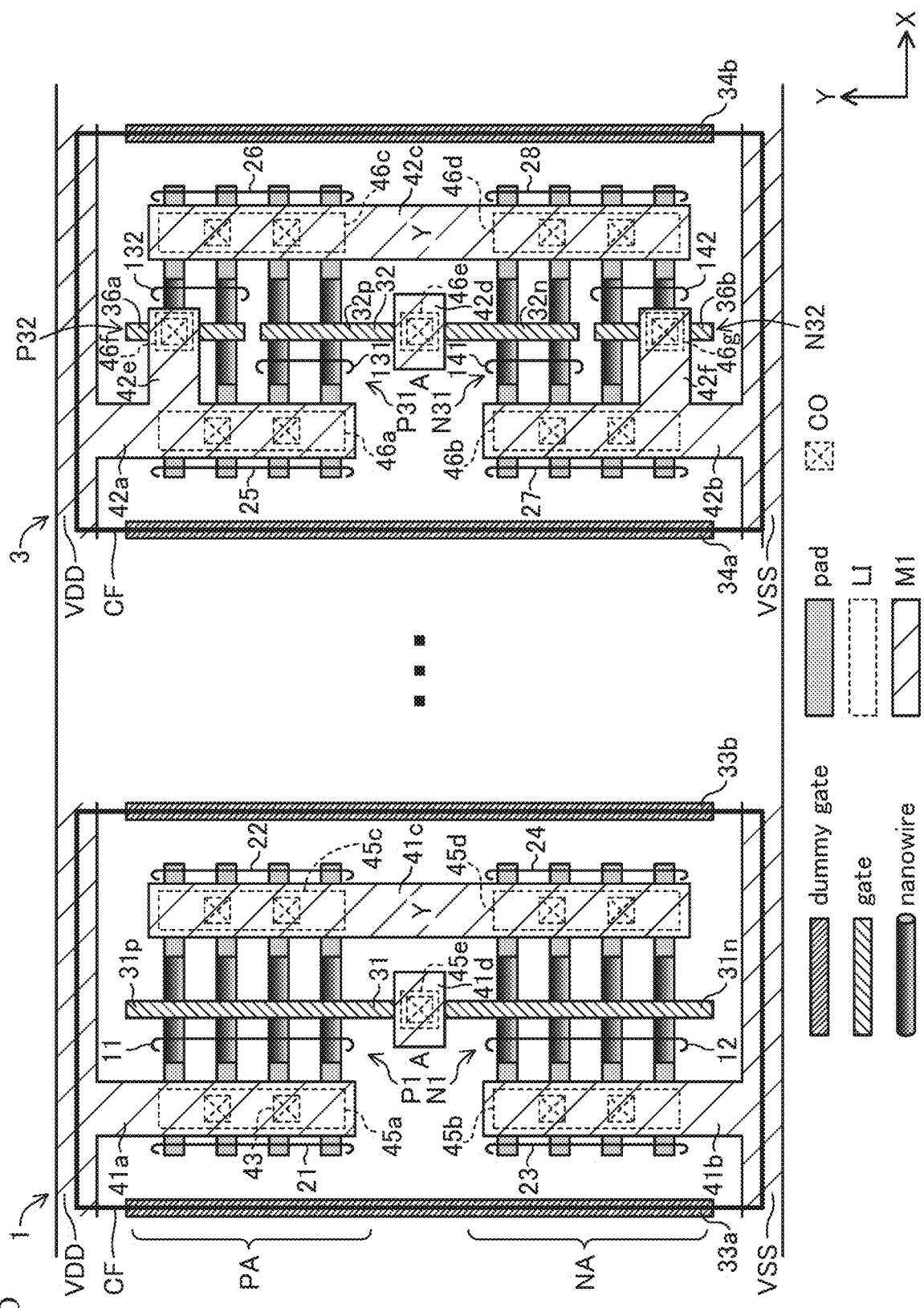
FIG. 6 is a plan view illustrating an example of a layout configuration of a semiconductor integrated circuit device according to a second embodiment.

FIG. 6 is a plan view illustrating an example of a layout configuration of a semiconductor integrated circuit device according to a second embodiment. Standard cells 1 and 3 illustrated in FIG. 6 each constitute an inverter having the input A and the output Y using nanowire FETs. Moreover, in FIG. 6, the standard cells 1 and 3 are disposed in the same cell row extending in the X direction. In the layout configuration of FIG. 6, the same reference numerals denote equivalent components to those in FIG. 1, and the detailed descriptions thereof may be omitted here. The layout configuration of the standard cell 1 is similar to that illustrated in the first embodiment.

In the standard cell 3, a P-type nanowire FET P31 is provided in a P-type transistor region PA, and an N-type nanowire FET N31 is provided in an N-type transistor region NA. Moreover, in the standard cell 3, a P-type nanowire FET P32 and an N-type nanowire FET N32 that are dummy transistors not contributing to the logical operation of the circuit are provided.

The nanowire FETs P31 and N31 each include a plurality of nanowires 131, 141 that extends in the X direction and that are provided in parallel. In this example, two of the nanowires 131 are arranged side by side in the Y direction, and so are two of the nanowires 141. Moreover, two of the nanowires 131 are arranged in the vertical direction, i.e., the direction perpendicular to the substrate, and so are two of the nanowires 141. The total number of the nanowires 131 is four, and the total number of the nanowires 141 is also four. The nanowires 131 and 141 are formed in a cylinder shape, extend above the substrate in the horizontal direction, i.e., in parallel with the substrate, and are made of silicon, for example. The standard cell 3 includes the pads 25 and 26 connected to the nanowires 131, and the pads 27 and 28 connected to the nanowires 141. The pads 25 and 26 each have a portion at least connected to the nanowires 131, the portion being doped with P-type impurities. The pads 25 and 26 serve as a source region or a drain region of the nanowire FET P31. The pads 27 and 28 each have a portion at least connected to the nanowires 141, the portion being doped with N-type impurities. The pads 27 and 28 serve as a source region or a drain region of the nanowire FET N31.

The standard cell 3 includes a gate interconnect 32 extending linearly in the Y direction. The gate interconnect 32 includes a gate electrode 32p of the nanowire FET P31 and a gate electrode 32n of the nanowire FET N31 which are connected together. The gate interconnect 32 surrounds predetermined regions, of the nanowires 131 and 141, in the X direction.

The nanowire FET P32 includes dummy nanowires 132 and a dummy gate electrode 36a. The dummy nanowires 132 are provided between the pads 25 and 26 to extend in the X direction in parallel with the nanowires 131. The dummy gate electrode 36a surrounds a periphery of the dummy nanowires 132 within a predetermined range of the dummy nanowires 132 in the X direction. The dummy gate electrode 36a is connected to an interconnect VDD through an interconnect 42e and a local interconnect 46f. In other words, the gate of the nanowire FET P32 is fixed to the power supply potential.

The nanowire FET N32 includes dummy nanowires 142 and a dummy gate electrode 36b. The dummy nanowires 142 are provided between the pads 27 and 28 to extend in the X direction in parallel with the nanowires 141. The dummy gate electrode 36b surrounds a periphery of the dummy nanowires 142 within a predetermined range of the dummy nanowires 142 in the X direction. The dummy gate electrode 36b is connected to the interconnect VSS through a interconnect 42f and a local interconnect 46g. In other words, the gate of the nanowire FET N32 is fixed to the ground potential.

Moreover, in this example, each of the pads 25, 26, 27, and 28 is divided into four parts spaced apart from one another in the Y direction. The four parts into which each of the pads 25 and 26 is divided are respectively connected to the two nanowires 131 arranged in the Y direction and the two dummy nanowires 132 arranged in the Y direction. The four parts into which each of the pads 27 and 28 is divided are respectively connected to the two nanowires 141 arranged in the Y direction and the two dummy nanowires 142 arranged in the Y direction.

The standard cell 3 is configured such that the gate electrode 31p of the nanowire FET P1 of the standard cell 1 is divided into two portions, an upper one of which in the drawing is fixed to the power supply potential; and the gate electrode 31n of the nanowire FET N1 of the standard cell 1 is divided into two portions, a lower one of which in the drawing is fixed to the ground potential.

In the configuration in FIG. 6, in the P-type transistor region PA, one end, in the Y direction, of each of the pads 21 and 22 of the nanowire FET P1 is aligned in the X direction with one end, in the Y direction, of each of the pads 25 and 26 in the standard cell 3, and the other end, in the Y direction, of the pad 21, 22 of the nanowire FET P1 is aligned in the X direction with one end, in the Y direction, of the pad 25, 26 in the standard cell 3. In other words, the pads 21 and 22 and the pads 25 and 26 are arranged in the same range in the Y direction. Moreover, one end, in the Y direction, of each of the pads 23 and 24 of the nanowire FET N1 is aligned in the X direction with one end, in the Y direction, of each of the pads 27 and 28 in the standard cell 3, and the other end, in the Y direction, of the pad 23, 24 of the nanowire FET N1 is aligned in the X direction with the other end of the pad 27, 27 in the standard cell 3. In other words, the pads 23 and 24 and the pads 27 and 28 are arranged in the same range in the Y direction.

With the configuration of FIG. 6, both ends, in the Y direction, of the pad of the nanowire FET P1 can be aligned in the X direction with both ends, in the Y direction, of the pad of the nanowire FET P31, respectively, the nanowire FETs P1 and P31 having different numbers of nanowires. Moreover, providing the nanowire FET P32 that is a dummy transistor allows the ends, in the Y direction, of the pads 25 and 26 to be easily aligned in the X direction with the associated ends, in the Y direction, of the pads 21 and 22 of the nanowire FET P1. Similarly, an end, in the Y direction, of each pad of the nanowire FET N1 can be aligned in the X direction with an associated end, in the Y direction, of each pad of the nanowire FET N31, the nanowire FET N1 and N32 having different numbers of nanowires. Furthermore, providing the nanowire FET N32 that is a dummy transistor allows the ends, in the Y direction, of the pads 27 and 28 to be easily aligned in the X direction with the associated ends, in the Y direction, of the pads 23 and 24 of the nanowire FET N1. This can facilitate manufacturing the semiconductor integrated circuit device, and reduce process-induced variations, thus improving the yield.

In the configuration of FIG. 6, both ends, in the Y direction, of the pads 21 and 22 are aligned in the X direction with the associated ends, in the Y direction, of the pads 25 and 26. However, only one of the ends of the pads 21 and 22 may be aligned with the associated ends of the pads 25 and 26, or none of the ends of the pads 21 and 22 may be aligned with the associated ends of the pads 25 and 26. Moreover, both ends, in the Y direction, of the pads 23 and 24 are aligned in the X direction with the associated ends, in the Y direction, of the pads 27 and 28. However, only one of the ends of the pads 23 and 24 may be aligned with the associated ends of the pads 27 and 28, or none of the ends of the pads 23 and 24 may be aligned with the associated ends of the pads 27 and 28.

Third Embodiment

Figure 7:
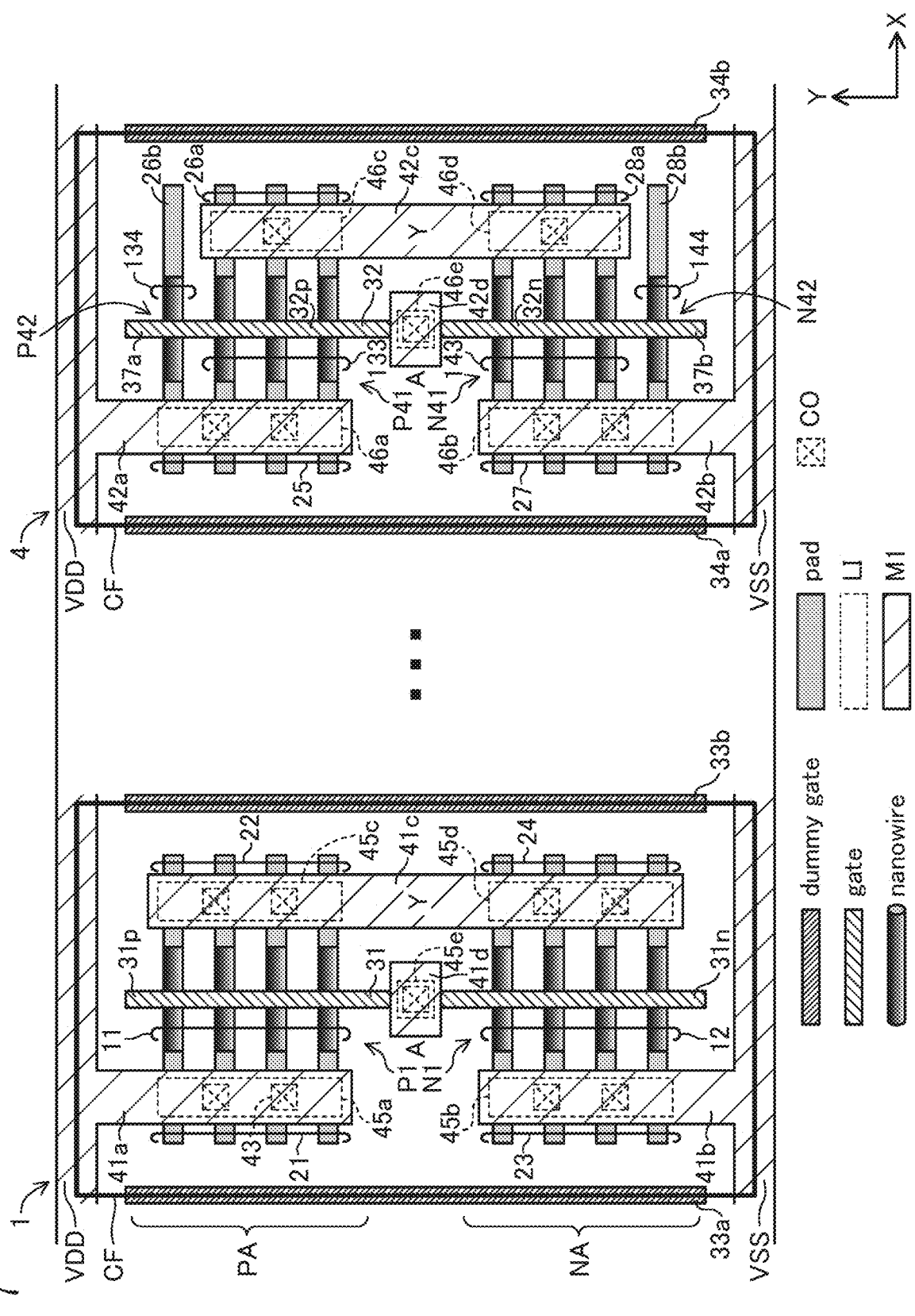
FIG. 7 is a plan view illustrating an example of a layout configuration of a semiconductor integrated circuit device according to a third embodiment.

FIG. 7 is a plan view illustrating an example of a layout configuration of a semiconductor integrated circuit device according to a third embodiment. Standard cells 1 and 4 illustrated in FIG. 7 each constitute an inverter having the input A and the output Y using nanowire FETs. Moreover, in FIG. 7, the standard cells 1 and 4 are disposed in the same cell row extending in the X direction. In the layout configuration of FIG. 7, the same reference numerals denote equivalent components to those in FIG. 1, and the detailed descriptions thereof may be omitted here. The layout configuration of the standard cell 1 is similar to that illustrated in the first embodiment.

In the standard cell 4, a P-type nanowire FET P41 is provided in the P-type transistor region PA, and an N-type nanowire FET N41 is provided in the N-type transistor region NA. The standard cell 4 also includes a P-type nanowire FET P42 and an N-type nanowire FET N42 that are dummy transistors not contributing to the logical operation of the circuit.

The nanowire FETs P41 and N41 each include a plurality of nanowires 133 and 143 that extend in the X direction and that are provided in parallel. In this example, three of the nanowires 133 are arranged side by side in the Y direction, and so are three of the nanowires 143. Moreover, two of the nanowires 133 are arranged in the vertical direction, i.e., the direction perpendicular to the substrate, and so are two of the nanowires 143. The total number of the nanowires 133 is six, and the total number of the nanowires 143 is also six. The nanowires 133 and 143 are formed in a cylinder shape, extend above the substrate in the horizontal direction, i.e., in parallel with the substrate, and are made of silicon, for example. The standard cell 4 also includes pads 25 and 26a connected to the nanowires 133, and pads 27 and 28a connected to the nanowires 143. The pads 25 and 26a each have a portion at least connected to the nanowires 133, the portion being doped with P-type impurities. The pads 25 and 26a serve as a source region or a drain region of the nanowire FET P41. The pads 27 and 28a each have a portion at least connected to the nanowires 143, the portion being doped with N-type impurities. The pads 27 and 28a serve as a source region or a drain region of the nanowire FET N41.

The standard cell 4 includes a gate interconnect 32 extending linearly in the Y direction. The gate interconnect 32 includes a gate electrode 32p of the nanowire FET P41 and a gate electrode 32n of the nanowire FET N41 which are connected together. The gate interconnect 32 surrounds a periphery of the nanowires 133 and 143 within a predetermined range of the nanowires 133 and 143 in the X direction.

The nanowire FET P42 includes a dummy nanowire 134 and a dummy pad 26b. The dummy pad 26b is disposed adjacent to the pad 26a in the Y direction. The dummy nanowire 134 is provided between the pad 25 and the dummy pad 26b to extend in the X direction in parallel with the nanowires 133. The gate interconnect 32 extends beyond the dummy nanowire 134 in the Y direction, and surrounds the dummy nanowire 134. In other words, a dummy gate electrode 37a of the nanowire FET P42 is connected to the gate electrode 32p of the nanowire FET P41.

The nanowire FET N42 includes a dummy nanowire 144 and a dummy pad 28b. The dummy pad 28b is disposed adjacent to the pad 28a in the Y direction. The dummy nanowire 144 is provided between the pad 27 and the dummy pad 28b to extend in the X direction in parallel with the nanowires 143. The gate interconnect 32 extends beyond the dummy nanowire 144 in the Y direction, and surrounds the dummy nanowire 144. In other words, a dummy gate electrode 37b of the nanowire FET N42 is connected to the gate electrode 32n of the nanowire FET N41.

Moreover, in this example, each of the pads 25 and 27 is divided into four parts spaced apart from one another in the Y direction. The four parts into which the pad 25 is divided are connected to the three nanowires 133 arranged in the Y direction and the dummy nanowire 134 provided in the Y direction, respectively. The four parts into which the pad 27 is divided are connected to the three nanowires 143 arranged in the Y direction and the dummy nanowire 144 provided in the Y direction, respectively. Furthermore, in this example, each of the pads 26a and 28a is divided into three parts spaced apart from one another in the Y direction. The three parts into which the pad 26a is divided are connected to the three nanowires 133 arranged in the Y direction. The three parts into which the pad 28a is divided are connected to the three nanowires 143 arranged in the Y direction, respectively.

The standard cell 4 is configured such that the pad 22 of the standard cell 1 is divided into two parts in the nanowire FET P1 and the pad 24 of the standard cell 1 is divided into two parts in the nanowire FET N1.

In the configuration of FIG. 7, in the P-type transistor region PA, each of both ends, in the Y direction, of the pads 21 and 22 of the nanowire FET P1 is aligned in the X direction with the associated end of the pad 25 of the standard cell 4. In other words, the pads 21 and 22 and the pad 25 are arranged in the same range in the Y direction. Moreover, the pad 26a and the dummy pad 26b are arranged in the same range as the pad 25 in the Y direction, and both ends, in the Y direction, of a combination of the pad 26a and the dummy pad 26b are aligned in the X direction with the associated ends, in the Y direction, of the pad 25. Furthermore, both ends, in the Y direction, of the pads 23 and 24 of the nanowire FET N1 are aligned in the X direction with the associated ends, in the Y direction, of the pad 27 of the standard cell 4. In other words, the pads 23 and 24 and the pad 27 are arranged in the same range in the Y direction. In addition, the pad 28a and the dummy pad 28b are arranged in the same range as the pad 27 in the Y direction, and both ends, in the Y direction, of a combination of the pad 28a and the dummy pad 28b are aligned in the X direction with the associated ends, in the Y direction, of the pad 27.

With the configuration of FIG. 7, both ends, in the Y direction, of the pad of the nanowire FET P1 are aligned in the X direction with both ends of the pad of the nanowire FET P41, respectively, the nanowire FETs P1 and P41 having different numbers of nanowires. Moreover, providing the nanowire FET P42 that is a dummy transistor allows the ends, in the Y direction, of a region including the pad 26a and the dummy pad 26b to be aligned in the X direction with the associated ends, in the Y direction, of the pads 21 and 22 of the nanowire FET P1. Similarly, in the nanowire FETs N1 and N41 with different numbers of nanowires, the ends, in the Y direction, of the pad of the nanowire FET N1 can be aligned in the X direction with the associated ends, in the Y direction, of the pad of the nanowire FET N41, the nanowire FETs N1 and N41 having different numbers of nanowires. Furthermore, providing the nanowire FET N42 that is a dummy transistor allows the ends, in the Y direction, of a region including the pad 28a and the dummy pad 28b to be easily aligned in the X direction with the associated ends, in the Y direction, of the pads 23 and 24 of the nanowire FET N1. This can facilitate manufacturing the semiconductor integrated circuit device, and reduce process-induced variations, thus improving the yield.

Another Example

Figure 8A:
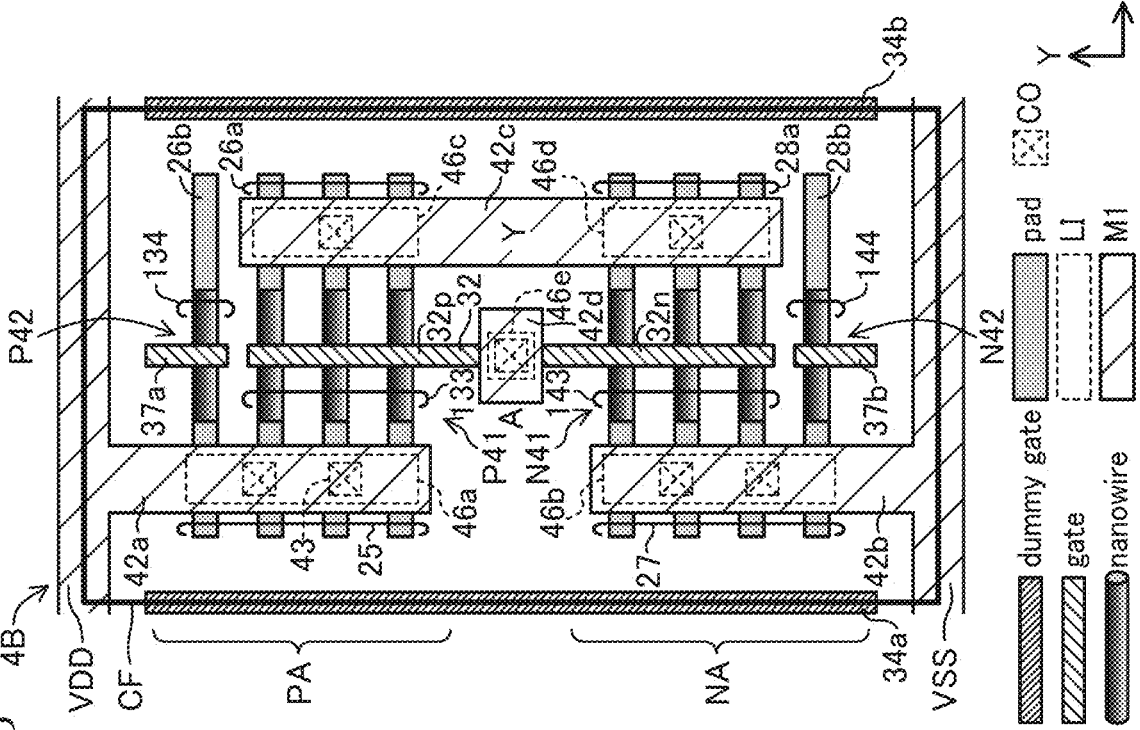
FIG. 8A illustrates another example of the standard cell in the third embodiment.
Figure 8B:
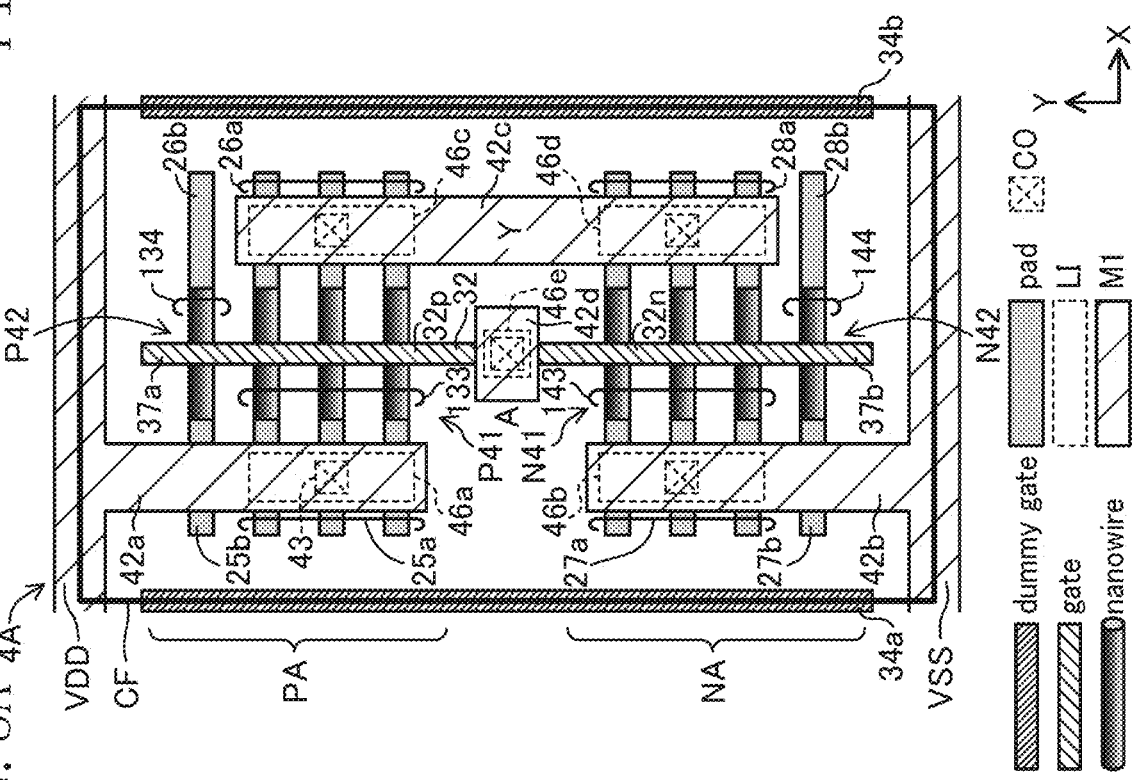
FIG. 8B illustrates another example of the standard cell in the third embodiment.

FIG. 8A illustrates another example of the standard cell 4 in the present embodiment. FIG. 8B illustrates another example of the standard cell 4 in the present embodiment. In a standard cell 4A in FIG. 8A, nanowire FETs P42 and N42 that are dummy transistors not contributing to the logical operation of a circuit each include two pads serving as dummy pads.

In other words, the nanowire FET P42 includes a dummy nanowire 134, a dummy pad 25b, and a dummy pad 26b. The dummy pad 25b is disposed adjacent to a pad 25a in the Y direction, and the dummy pad 26b is disposed adjacent to a pad 26a in the Y direction. The dummy nanowire 134 is provided between the dummy pad 25b and the dummy pad 26b to extend in the X direction in parallel with the nanowires 133. A gate interconnect 32 extends beyond the dummy nanowire 134 in the Y direction, and surrounds the dummy nanowire 134. In other words, a dummy gate electrode 37a of the nanowire FET P42 is connected to a gate electrode 32p of the nanowire FET P41.

The nanowire FET N42 also includes a dummy nanowire 144, a dummy pad 27b, and a dummy pad 28b. The dummy pad 27b is disposed adjacent to a pad 27a in the Y direction. The dummy pad 28b is disposed adjacent to a pad 28a in the Y direction. The dummy nanowire 144 is provided between the dummy pad 27b and the dummy pad 28b to extend in the X direction in parallel with the nanowires 143. The gate interconnect 32 extends beyond the dummy nanowire 144 in the Y direction, and surrounds the dummy nanowire 144. In other words, a dummy gate electrode 37b of the nanowire FET N42 is connected to a gate electrode 32n of the nanowire FET N41.

Moreover, in this example, each of the pads 25a and 27a is divided into three parts spaced apart from one another in the Y direction. The three parts into which the pad 25a has been divided are connected to the respective three nanowires 133 arranged in the Y direction. The three parts into which the pad 27a has been divided are connected to the respective three nanowires 143 arranged in the Y direction.

In a standard cell 4B in FIG. 8B, in the nanowire FETs P42 and N42 that are dummy transistors not contributing to the logical operation of the circuit, the dummy gate electrode is separated from the gate interconnect 32.

In other words, the nanowire FET P42 includes a dummy nanowire 134 and a dummy pad 26b. A dummy gate electrode 37a is aligned with the gate interconnect 32, and surrounds a dummy nanowire 134. The dummy gate electrode 37a is separated from a gate electrode 32p of the nanowire FET P41. The nanowire FET N42 includes the dummy nanowire 144 and the dummy pad 28b. The dummy gate electrode 37b is aligned with the gate interconnect 32, and surrounds a dummy nanowire 144. The dummy gate electrode 37b is separated from a gate electrode 32n of the nanowire FET N41.

In FIGS. 7 and 8(b), the right pad of each of the nanowire FETs P42 and N 42 in the drawing is separated from the pad of an associated one of the nanowire FETs P41 and N41, and in FIG. 8A, both pads are separated from the pads of the nanowire FETs P41 and N41. However, the embodiments are merely an example of the present disclosure, and only the left pad in the drawing may be separated. Moreover, in FIG. 8B, in the layout in which the right pad of each of the nanowire FETs P42 and N42 that are dummy transistors in the drawing is separated, the dummy gate electrode is separated from the gate electrode of an associated one of the nanowire FETs P41 and N41. However, the embodiments are merely an example of the present disclosure, and the dummy gate electrode may be separated in the layout in which both pads are separated or in the layout in which the left pad in the drawing is separated.

Moreover, in the present embodiment, in the nanowire FETs P42 and N42 that are dummy transistors, a single nanowire is present in the plan view. However, this is merely an example of the present disclosure, and the nanowire FETs P42 and N42 may include two or more nanowires in the plan view. Furthermore, the standard cells 4, 4A, and 4B each have a layout in which the P-type region and the N-type region are symmetric to each other with a horizontal line. However, this is merely an example of the present disclosure. For example, the nanowire FET serving as a dummy transistor may be provided only in the P-type region, and the separation mode of the pads and the number of nanowires may differ between the P-type region and the N-type region.

In the embodiments described above, the standard cell 1 is disposed in the same cell row as that of the standard cells 2, 3, and 4, and any other cell. However, the standard cell 1 may be disposed in a different cell row from that of the standard cells 2, 3, and 4, and any other cell. Alternatively, the standard cell 1 may be disposed adjacent to the standard cells 2, 3, and 4, and any other cell in the same cell row. In this case, the dummy gate interconnects 33b and 34a each disposed on one side of the associated cell frame CF are shared.

Moreover, in the embodiments described above, the standard cell 1 and other cells each constitute an inverter. However, the standard cell 1 and other cells may each constitute another circuit. Furthermore, the standard cell 1, and the standard cells 2, 3, and 4, and other cells may constitute different circuits. Still furthermore, the standard cell 1, and the standard cells 2, 3, and 4, and other cells may each include a nanowire FET other than the nanowire FET in which the ends, in the Y direction, of the pads are aligned in the X direction with each other.

Fourth Embodiment

In the embodiments described above, the two nanowire FETs in which the ends, in the Y direction, of the pads are aligned in the X direction with each other are included in different standard cells. However, the two nanowire FETs in which the ends, in the Y direction, of the pads are aligned in the X direction with each other may be included in a single standard cell.

Figure 9:
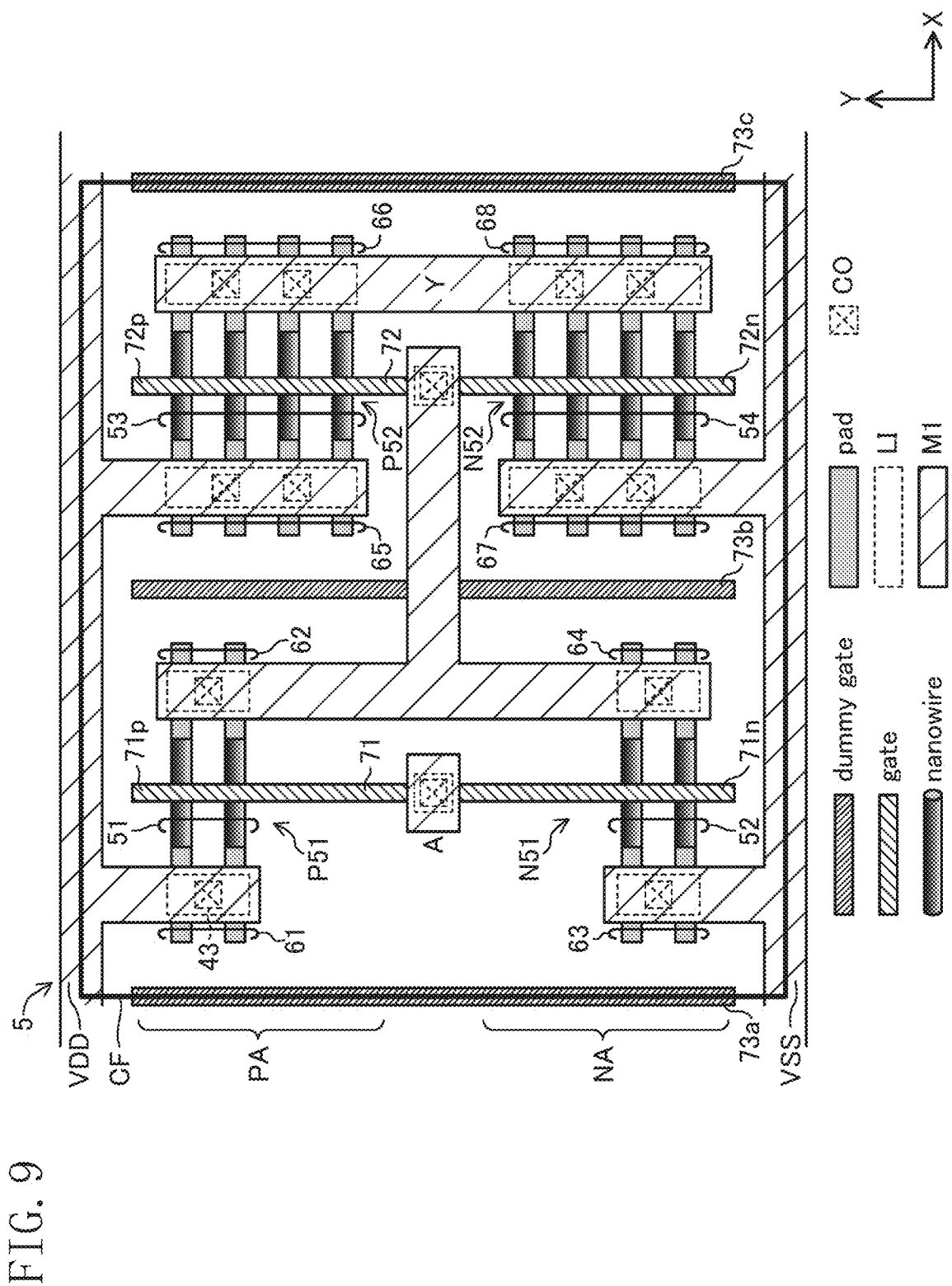
FIG. 9 is a plan view illustrating an example of a layout configuration of a semiconductor integrated circuit device according to a fourth embodiment.

FIG. 9 is a plan view illustrating an example of a layout configuration of a semiconductor integrated circuit device according to a fourth embodiment. The layout configuration in FIG. 9 corresponds to a configuration in which the nanowire FETs P1, P2, N1, and N2 in the layout configuration of FIG. 1 are disposed in a single standard cell.

In FIG. 9, a standard cell 5 has a P-type transistor region PA including P-type nanowire FETs P51 and P52, and an N-type transistor region NA including nanowire FETs N51 and N52. The nanowire FET P52 includes Na (where Na is an integer of 2 or more) nanowires 53 that extend in the X direction and that are provided in parallel, and the nanowire FET N52 includes Na nanowires 54 that extend in the X direction and that are provided in parallel. In this example, four of the nanowires 53 are arranged side by side in the Y direction, and so are four of the nanowires 54. Moreover, two of the nanowires 53 are arranged in the vertical direction, i.e., the direction perpendicular to the substrate, and so are two of the nanowires 54. The total number of the nanowires 53 is eight, and the total number of the nanowires 54 is also eight (Na=8). The nanowire FET P51 includes Nb (where Nb is an integer of 1 or more and less than Na) nanowires 51 that extending in the X direction and that are provided in parallel, and the nanowire FET N51 includes Nb nanowires 52 that extend in the X direction and that are provided in parallel. In this example, two of the nanowires 51 are arranged side by side in the Y direction, and two of the nanowires 52 are arranged side by side in the Y direction. Moreover, two of the nanowires 51 are arranged in the vertical direction, i.e., the direction perpendicular to the substrate, and so are two of the nanowires 52. The total number of the nanowires 51 is four, and the total number of the nanowires 52 is also four (Nb=4). The nanowires 51, 52, 53, and 54 are formed in a cylinder shape, extend above the substrate in the horizontal direction, i.e., in parallel with the substrate, and are made of silicon, for example. The standard cell 5 also includes a pair of pads 61 and 62 connected to the nanowires 51, a pair of pads 63 and 64 connected to the nanowires 52, a pair of pads 65 and 66 connected to the nanowires 53, and a pair of pads 67 and 68 connected to the nanowires 54. The pads 61, 62, 65, and 66 each have a portion at least connected to associated ones of the nanowires 51 and 53, the portion being doped with P-type impurities. The pads 61, 62, 65, and 66 each serve as a source region or a drain region of an associated one of the nanowire FETs P51 and P52. The pads 63, 64, 67, and 68 each have a portion at least connected to associated ones of the nanowires 52 and 54, the portion being doped with N-type impurities. The pads 63, 64, 67, and 68 each serve as a source region or a drain region of an associated one of the nanowire FETs N51 and N52.

Moreover, in this example, each of the pads 61, 62, 63, and 64 is divided into two parts spaced apart from each other in the Y direction. The two parts into which the pad 61 has been divided are connected to the respective two nanowires 51 arranged in the Y direction. The divided two portions of the pad 62 are connected to the respective two nanowires 51 arranged in the Y direction. The two parts into which the pad 63 has been divided are connected to the respective two nanowires 52 arranged in the Y direction. The two parts into which the pad 64 has been divided are connected to the respective two nanowires 52 arranged in the Y direction. Furthermore, in this example, each of the pads 65, 66, 67, and 68 is divided into four parts spaced apart from one another in the Y direction. The four parts into which the pad 65 has been divided are connected to the respective four nanowires 53 arranged in the Y direction. The four parts into which the pad 66 has been divided are connected to the respective four nanowires 53 arranged in the Y direction. The four portions into which the pad 67 has been divided are connected to the respective four nanowires 54 arranged in the Y direction. The four parts into which the pad 68 has been divided are connected to the respective four nanowires 54 arranged in the Y direction.

The standard cell 5 includes gate interconnects 71 and 72 extending linearly in the Y direction. The gate interconnect 71 includes a gate electrode 71p of the nanowire FET P51 and a gate electrode 71n of the nanowire FET N51 which are connected together. The gate interconnect 71 surrounds a periphery of the nanowires 51 and 52 within a predetermined range of the nanowires 51 and 52 in the X direction. The gate interconnect 72 includes a gate electrode 72p of the nanowire FET P52 and a gate electrode 72n of the nanowire FET N52 which are connected together. The gate interconnect 72 surrounds a periphery of the nanowires 53 and 54 within a predetermined range of the nanowires 53 and 54 in the X direction. Moreover, dummy gate interconnects 73a, 73b, and 73c extending in the Y direction are each disposed on an associated one of the lateral sides and a central portion in the X direction of the cell frame CF of the standard cell 5.

In the P-type transistor region PA, the ends, in the Y direction, of the pads 61 and 62 of the nanowire FET P51 closer to the interconnect VDD (the upper ends in the drawing) are aligned in the X direction with the ends, in the Y direction, of the pads 65 and 66 of the nanowire FET P52 closer to the interconnect VDD (the upper ends in the drawing). Moreover, in the N-type transistor region, the ends, in the Y direction, of the pads 63 and 64 of the nanowire FET N51 closer to the interconnect VSS (the lower ends in the drawing) are aligned in the X direction with the ends, in the Y direction, of the pads 67 and 68 of the nanowire FET N52 closer to the interconnect VSS (the lower ends in the drawing). This allows both ends, in the Y direction, of the pad of the nanowire FET P51 to be aligned in the X direction with both ends of the pad of the nanowire FET P52, respectively, the nanowire FETs P51 and P52 having different numbers of nanowires. Similarly, both ends, in the Y direction, of the pad of the nanowire FET N51 can be aligned in the X direction with both ends, in the Y direction, of the pad of the nanowire FET N52, respectively, the nanowire FETs N51 and N52 having different numbers of nanowires. This can facilitate manufacturing the semiconductor integrated circuit device, and reduce process-induced variations, thus improving the yield.

Just like the configuration in FIG. 9, a single standard cell may have one of the other layout configurations indicated in the first to third embodiments. For example, just like the configurations in FIGS. 4 and 5, the associated ends, in the Y direction, of the pads of the nanowire FETs with different numbers of nanowires can be aligned in the X direction with each other.

Fifth Embodiment

Figure 10:
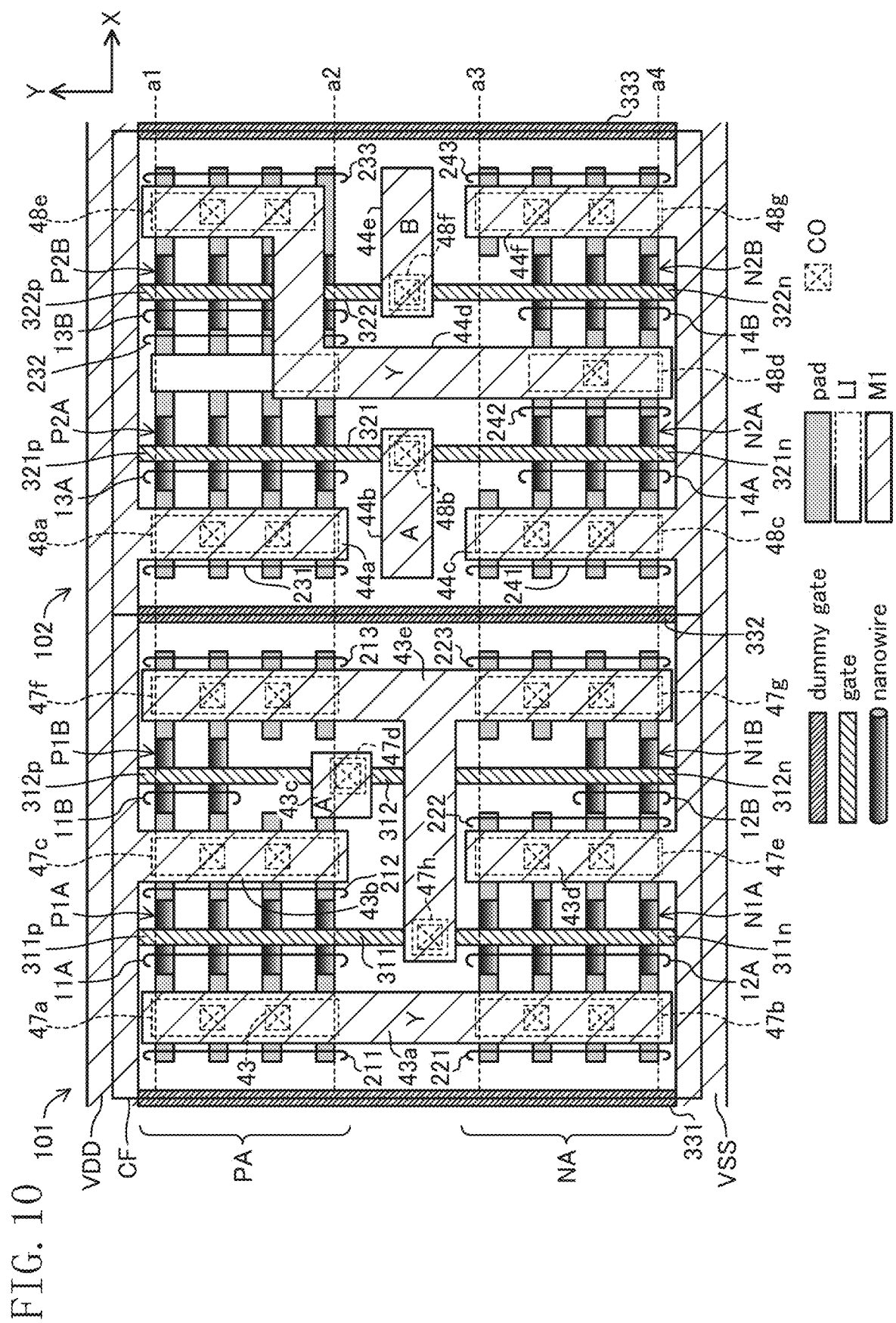
FIG. 10 is a plan view illustrating an example of a layout configuration of the semiconductor integrated circuit device according to the fifth embodiment.

FIG. 10 is a plan view illustrating an example of a layout configuration of the semiconductor integrated circuit device according to a fifth embodiment. In FIG. 10, standard cells 101 and 102 are disposed in the same cell row extending in the X direction, and are disposed adjacent to each other in the X direction.

Figure 11A:
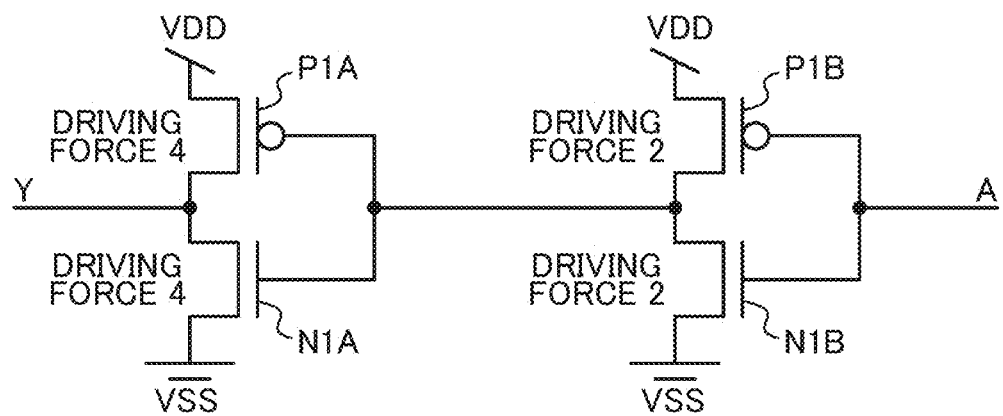
FIGS. 11A and 11B show circuit diagrams of the standard cells in FIG. 10.
Figure 11B:
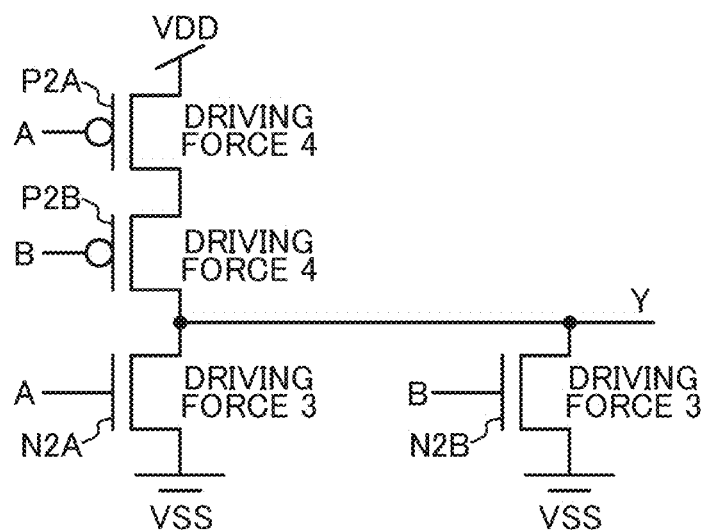

FIGS. 11A and 11B illustrates circuit diagrams of the standard cells 101 and 102 illustrated in FIG. 10. As illustrated in FIG. 11A, the standard cell 101 constitutes a buffer circuit having an input A and an output Y. In this buffer circuit, an inverter including nanowire FETs P1B and N1B that are connected in series and an inverter including nanowire FETs P1A and N1A that are connected in series are connected in series. As illustrated in FIG. 11B, the standard cell 102 constitutes a two-input NOR circuit having an input A, an input B, and an output Y. In the two-input NOR circuit, nanowire FETs P2A and P2B connected in series are provided between the output Y and VDD, and nanowire FETs N2A and N2B connected in parallel are provided between the output Y and VSS. The input A is applied to the gates of the nanowire FETs P2A and N2A, and the input B is applied to the gates of the nanowire FETs P2B and N2B. The circuit diagrams in FIGS. 11A and 11B show relative value of driving force of each of the nanowire FETs. In the present embodiment, the driving force of each nanowire FET is set by the number of nanowires.

Returning to the layout in FIG. 10, the standard cells 101 and 102 each have a P-type transistor region PA and an N-type transistor region NA arranged side by side in the Y direction. Each of the standard cells 101 and 102 includes four nanowire FETs. In other words, the standard cell 101 has the P-type transistor region PA including the P-type nanowire FETs P1A and P1B, and the N-type transistor region NA including the N-type nanowire FETs N1A and N1B. Moreover, the standard cell 102 has the P-type transistor region PA including the P-type nanowire FETs P2A and P2B, and the N-type transistor region NA including the N-type nanowire FETs N2A and N2B.

In the standard cell 101, the nanowire FETs P1A and N1A each include a plurality of nanowires 11A and 12A that extend in the X direction and that are provided in parallel. In this example, four of the nanowires 11A are arranged side by side in the Y direction, and so are four of the nanowires 12A. Moreover, two of the nanowires 11A are arranged in the vertical direction, i.e., the direction perpendicular to the substrate, and so are two of the nanowires 12A. The total number of the nanowires 11A is eight, and the total number of the nanowires 12A is also eight. The nanowire FETs P1B and N1B each include a plurality of nanowires 11B and 12B that extend in the X direction and that are provided in parallel. In this example, two of the nanowires 11B are arranged side by side in the Y direction, and so are two of the nanowires 12B. Furthermore, two of the nanowires 11B are arranged in the vertical direction, i.e., the direction perpendicular to the substrate, and so are two of the nanowires 12B. The total number of the nanowires 11B is four, and the total number of the nanowires 12B is also four. In the standard cell 102, the nanowire FETs P2A and P2B each include a plurality of nanowires 13A and 13B that extend in the X direction and that are provided in parallel. In this example, four of the nanowires 13A are arranged side by side in the Y direction, and so are four of the nanowires 13B. Moreover, two of the nanowires 13A are arranged in the vertical direction, i.e., the direction perpendicular to the substrate, and so are two of the nanowires 13B. The total number of the nanowires 13A is eight, and the total number of the nanowires 13B is also eight. Furthermore, the nanowire FETs N2A and N2B each include a plurality of nanowires 14A and 14B that extend in the X direction and that are provided in parallel. In this example, three of the nanowires 14A are arranged side by side in the Y direction, and so are three of the nanowires 14B. Moreover, two of the nanowires 14A are arranged in the vertical direction, i.e., the direction perpendicular to the substrate, and so are two of the nanowires 14B. The total number of the nanowires 14A is six, and the total number of the nanowires 14B is also six. The nanowires 11A, 11B, 12A, 12B, 13A, 13B, 14A, and 14B are formed in a cylinder shape, extend above the substrate in the horizontal direction, i.e., in parallel with the substrate, and are made of silicon, for example.

Furthermore, the standard cell 101 includes three pads 211, 212, and 213 into which P-type impurities are doped, and three pads 221, 222, and 223 into which N-type impurities are doped. The nanowire FETs P1A and P1B commonly use one of the pads, in other words, the pad 212. In other words, the nanowire FET P1A includes a pair of the pads 211 and 212 connected to the nanowires 11A, and the nanowire FET P1B includes a pair of the pads 212 and 213 connected to the nanowires 11B. The nanowire FETs N1A and N1B commonly use one of the pads, in other words, the pad 222. In other words, the nanowire FET N1A includes a pair of the pads 221 and 222 connected to the nanowires 12A, and the nanowire FET N1B includes a pair of the pads 222 and 223 connected to the nanowires 12B.

The standard cell 102 includes three pads 231, 232, and 233 all doped with P-type impurities, and three pads 241, t242, and 243 all doped with N-type impurities. The nanowire FETs P2A and P2B commonly use one of the pads, i.e., the pad 232. In other words, the nanowire FET P2A includes a pair of the pads 231 and 232 connected to the nanowires 13A, and the nanowire FET P2B includes a pair of the pads 232 and 233 connected to the nanowires 13B. The nanowire FETs N2A and N2B commonly use one of the pads, in other words, the pad 242. In other words, the nanowire FET N2A includes a pair of the pads 241 and 242 connected to the nanowires 14A, and the nanowire FET N2B includes a pair of the pads 242 and 243 connected to the nanowires 14B.

Moreover, in this example, each of the pads 211, 212, 213, 221, 222, and 223 is divided into four parts spaced apart from each other in the Y direction. The four parts into which each of the pads 211 and 212 has been divided are connected to the respective four nanowires 11A arranged in the Y direction. Two upper ones of the four parts of each of the pads 212 and 213 in the drawing are connected to two of the nanowires 11B arranged in the Y direction, respectively. The four parts of each of the pads 221 and 222 are connected to four of the nanowires 12A arranged in the Y direction, respectively. Two lower ones of the four parts of each of the pads 222 and 223 in the drawing are connected to two of the nanowires 12B arranged in the Y direction, respectively.

Furthermore, in this example, each of the pads 231, 232, 233, 241, and 243 is divided into four parts spaced apart from one another in the Y direction, and the pad 242 is divided into three parts spaced apart from one another in the Y direction. The four parts into which each of the pads 231 and 232 has been divided are connected to four of the nanowires 13A arranged in the Y direction, respectively. The four parts into which each of the pads 232 and 233 has been divided are connected to four of the nanowires 13B arranged in the Y direction, respectively. Three lower ones of the four parts of the pad 241 in the drawing are connected to three of the nanowires 14A arranged in the Y direction, respectively. The three parts of the pad 242 are respectively connected to three of the nanowires 14A arranged in the Y direction and three of the nanowires 14B arranged in the Y direction. Three lower ones of the four parts of the pad 243 in the drawing are connected to three of the nanowires 14B arranged in the Y direction, respectively.

The standard cell 101 includes gate interconnects 311 and 312 extending linearly in the Y direction, and the standard cell 102 includes gate interconnects 321 and 322 extending linearly in the Y direction. In the standard cell 101, the gate interconnect 311 includes a gate electrode 311p of the nanowire FET HA and a gate electrode 311n of the nanowire FET N1A which are connected together, and surrounds a periphery of the nanowires 11A and 12A within a predetermined range of the nanowires 11A and 12A in the X direction. The gate interconnect 312 includes a gate electrode 312p of the nanowire FET P1B and a gate electrode 312n of the nanowire FET N1B which are connected together, and surrounds a periphery of the nanowires 11B and 12B within a predetermined range of the nanowires 11B and 12B in the X direction. In the standard cell 102, the gate interconnect 321 includes a gate electrode 321p of the nanowire FET P2A and a gate electrode 321n of the nanowire FET N2A which are connected together, and surrounds a periphery of the nanowires 13A and 14A within a predetermined range of the nanowires 13A and 14A in the X direction. The gate interconnect 322 includes a gate electrode 322p of the nanowire FET P2B and a gate electrode 322n of the nanowire FET N2B which are connected together, and surrounds a periphery of the nanowires 13B and 14B within a predetermined range of the nanowires 13B and 14B in the X direction. Moreover, dummy gate interconnects 331, 332, and 333 extending in the Y direction are each disposed on an associated side of the cell frames CF of the standard cells 101 and 102.

The lower surfaces of the pads 211 to 213, 221 to 223, 231 to 233, and 241 to 243 are lower than the lower surfaces of the nanowires 11A, 11B, 12A, 12B, 13A, 13B, 14A, and 14B. Moreover, the upper surfaces of the nanowires 11A, 11B, 12A, 12B, 13A, 13B, 14A, and 14B is flush with the upper surfaces of the pads 211 to 213, 221 to 223, 231 to 233, and 241 to 243. The gate electrodes 311p, 312p, 311n, 312n, 321p, 322p, 321n, and 322n surround the nanowires 11A, 11B, 12A, 12B, 13A, 13B, 14A, and 14B. In other words, the upper surface, both side surfaces, and the lower surface of the channel region of each of the nanowires 11A, 11B, 12A, 12B, 13A, 13B, 14A, and 14B are all surrounded by an associated one of the gate electrodes 311p, 312p, 311n, 312n, 321p, 322p, 321n, and 322n with an insulating film interposed therebetween. Note that the upper surfaces of the nanowires 11A, 11B, 12A, 12B, 13A, 13B, 14A, and 14B may be lower than the upper surfaces of the pads 211 to 213, 221 to 223, 231 to 233, and 241 to 243.

The metal interconnect layer M1 is formed above the nanowire FETs P1A, P1B, N1A, N1B, P2A, P2B, N2A and N2B. The metal interconnect layer M1 includes an interconnect VDD disposed on the upper side of the cell frame CF and supplying a power supply potential, and an interconnect VSS disposed on the lower side of the cell frame CF and supplying a ground potential. Moreover, the metal interconnect layer M1 includes interconnects 43a to 43e formed in the standard cell 101, and interconnects 44a to 44f formed in the standard cell 102.

In the standard cell 101, the interconnect 43a connects the pads 211 and 221 together. The interconnect 43a is connected to the pad 211 via a local interconnect 47a, and connected to the pad 221 via a local interconnect 47b. The interconnect 43b extends downward in the Y direction from the interconnect VDD, and is connected to the pad 212 via a local interconnect 47c. The interconnect 43c is connected to the gate interconnect 312 via a local interconnect 47d. The interconnect 43d extends upward in the Y direction from the interconnect VSS, and is connected to the pad 222 via a local interconnect 47e. The interconnect 43e connects the pads 213 and 223 and the gate interconnect 311 together. The interconnect 43e is connected to the pad 213 via a local interconnect 47f, connected to the pad 223 via a local interconnect 47g, and connected to the gate interconnect 311 via a local interconnect 47h. The interconnects 43a and 43c correspond to the respective output Y and the input A of the buffer circuit constituted by the standard cell 101.

In the standard cell 102, the interconnect 44a extends downward in the Y direction from the interconnect VDD, and is connected to the pad 231 via a local interconnect 48a. The interconnect 44b is connected to the gate interconnect 321 via a local interconnect 48b. The interconnect 44c extends upward in the Y direction from the interconnect VSS, and is connected to the pad 241 via a local interconnect 48c. The interconnect 44d connects the pads 242 and 233 together. The interconnect 44d is connected to the pad 242 via a local interconnect 48d, and connected to the pad 233 via a local interconnect 48e. The interconnect 44e is connected to the gate interconnect 322 via a local interconnect 48f. The interconnect 44f extends upward in the Y direction from the interconnect VSS, and is connected to the pad 243 via a local interconnect 48g. The interconnects 44b, 44d, and 44e correspond to the input A, the output Y, and the input B of the two-input NOR circuit constituted by the standard cell 102, respectively.

In this example, the metal interconnects 43a to 43e are each connected to associated ones of the pads 211 to 213 and 221 to 223, and the gate interconnects 311 and 312 through associated ones of the local interconnects 47a to 47h and the contacts 43, and the metal interconnects 44a to 44f are connected to associated ones of the pads 231, 233, and 241 to 243, and the gate interconnects 321 and 322 through associated ones of the local interconnects 48a to 48g and the contacts 43. However, the metal interconnects may be connected to associated ones of the pads and the gate interconnects only through an associated one of the local interconnects without going through the associated contact, or only through an associated one of the contacts without going through the associated local interconnect.

The layout configuration of FIG. 10 has the following characteristics.

Attention is given to the P-type transistor region PA of the standard cell 101. The nanowire FET P1A serving as a first nanowire FET and the nanowire FET P1B serving as a second nanowire FET share the pad 212 serving as a common pad. The nanowire FET includes Na (eight in this example) nanowires 11A provided between the pads 211 and 212, and the nanowire FET P1B includes Nb (<Na, four in this example) nanowires 11B provided between the pads 212 and 213. Although the numbers of the nanowires of the nanowire FETs HA and P1B are different, the pads 211, 212, and 213 are arranged at the same position and in the same range in the Y direction (the broken lines a1 and a2). This allows the position and the arrangement range of the pad 213 in the Y direction to be the same as those of the pad 231 in the adjacent standard cell 102, respectively. Note that the nanowire FET P1B is closest to the cell end of the standard cell 102 in the X direction among the nanowire FETs included in the standard cell 101.

The same applies to the N-type transistor region NA. The nanowire FET N1A serving as a first nanowire FET and the nanowire FET N1B serving as a second nanowire FET share the pad 222 serving as a common pad. The nanowire FET N1A includes Na (eight in this example) nanowires 12A provided between the pads 221 and 222, and the nanowire FET N1B includes Nb (<Na, four in this example) nanowires 11B provided between the pads 222 and 223. Although the numbers of the nanowires of the nanowire FETs N1A and N1B are different, the pads 221, 222, and 223 are arranged at the same position and in the same range in the Y direction (the broken lines a3 and a4). This allows the position and the arrangement range of the pad 223 in the Y direction to be the same as those of the pad 241 in the adjacent standard cell 102, respectively. Note that the nanowire FET N1B is closest to the cell end of the standard cell 102 in the X direction among the nanowire FETs included in the standard cell 101.

Attention is given to the N-type transistor region NA in the standard cell 102. The nanowire FET N2A serving as a first nanowire FET and the nanowire FET N2B serving as a second nanowire FET share the pad 242 serving as a common pad. The nanowire FET N2A includes Na (six in this example) nanowires 14A provided between the pads 241 and 242, and the nanowire FET N2B includes Na (six in this example) nanowires 14B provided between the pads 242 and 243. The pads 241 and 243 are arranged in the same range in the Y direction as that of the pad connected to the four nanowires, such as the pad 231. In other words, the arrangement range of the pad 242 in the Y direction is smaller than that of each of the pads 241 and 243. This allows the position and the arrangement range of the pad 241 in the Y direction to be the same as those of the pad 223 in the adjacent standard cell 101, respectively. Note that the nanowire FET N2A is closest to the cell end of the standard cell 101 in the X direction among the nanowire FETs included in the standard cell 102.

When the standard cells 101 and 102 are viewed at the same time, the pads 231 and 232 of the nanowire FET P2A serving as the first nanowire FET including the Na (eight in this example) nanowires 13A; and the pads 211, 212, and 213 of the nanowire FET P1B serving as the second nanowire FET including the Nb (<Na, four in this example) nanowires 11B and the nanowire FET HA serving as the third nanowire FET including the Na (eight in this example) nanowires 11A are arranged at the same position and in the same range in the Y direction.

The configuration described above allows the pads facing each other with the boundary of the adjacent standard cells interposed therebetween to be uniformly affected by stress, regardless of the types of the standard cells. Consequently, the current characteristics of the nanowire FET in the standard cell can be stabilized regardless of the type of the adjacent standard cell. This can reduce the deviation in performance between a cell library and an actual product.

Another Example

Figure 12:
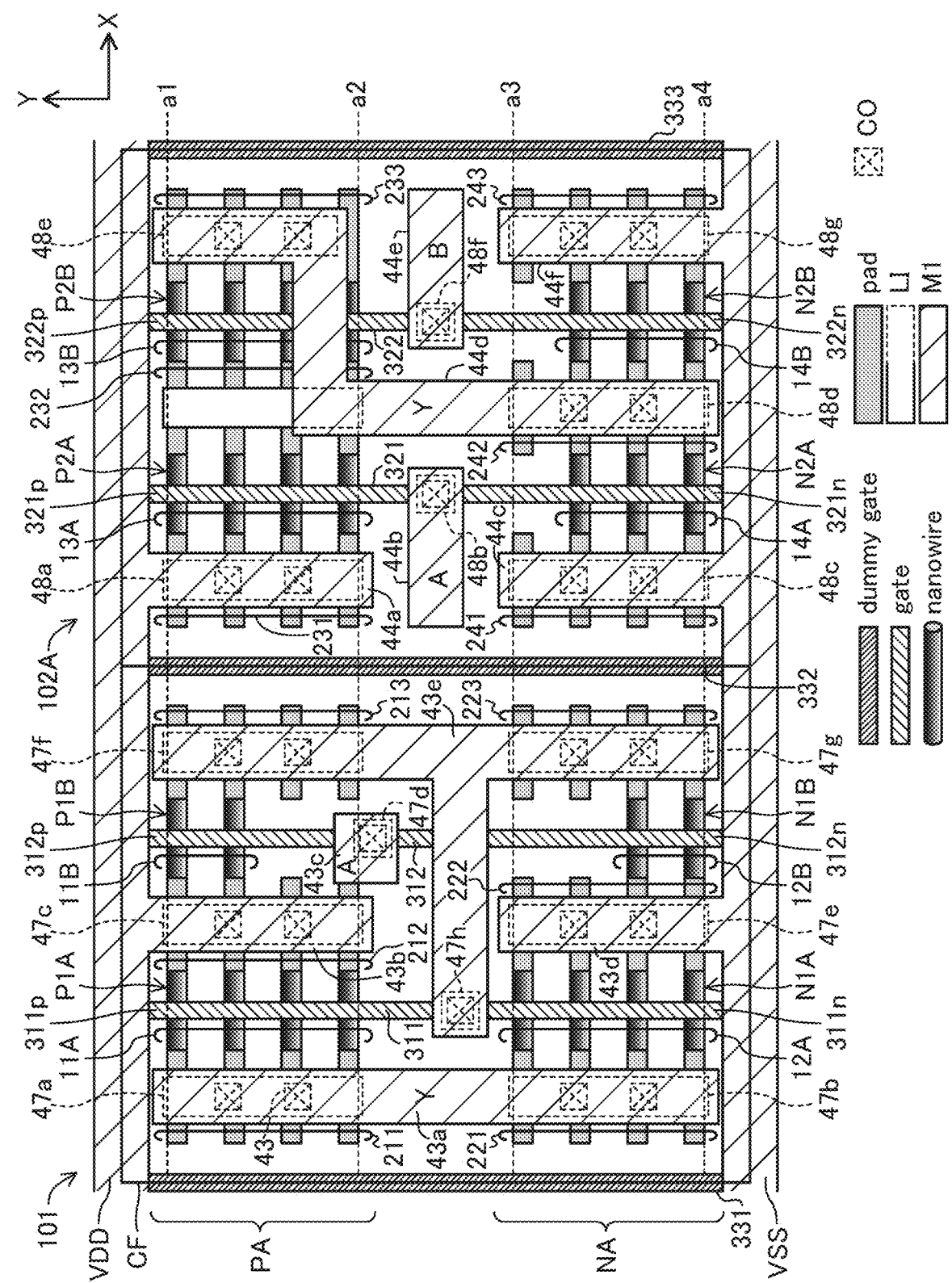
FIG. 12 is a plan view illustrating a further example of the layout configuration of the semiconductor integrated circuit device according to the first embodiment.

FIG. 12 is a plan view illustrating another example of the layout configuration of the semiconductor integrated circuit device according to the present embodiment. The layout configuration in FIG. 12 is basically the same as that in FIG. 1, the same reference numerals denote equivalent components, and the detailed descriptions thereof may be omitted here. In FIG. 12, the layout of a standard cell 102A is slightly different from that of the standard cell 102 in FIG. 10. In other words, in the standard cell 102A, the arrangement range of a pad 242 in the Y direction is increased, and the pad 242 is divided into four parts spaced apart from one another in the Y direction. Moreover, a pad 241, the pad 242, and a pad 243 are arranged in the same range and at the same position in the Y direction (the broken lines a3 and a4).

In other words, when the standard cells 101 and 102A are viewed at the same time, pads 221 and 222 of a nanowire FET N1A serving as a first nanowire FET including Na (eight in this example) nanowires 12A and the pads 241, 242, and 243 of a nanowire FET N2A serving as a second nanowire FET including Nb (<Na, six in this example) the nanowires 14A and a nanowire FET N2B serving as a third nanowire FET including Nc (<Na, six in this example) nanowires 14B are arranged at the same position and in the same range in the Y direction.

Consequently, in addition to the advantages obtained by the configuration in FIG. 10 described above, the following advantage is obtained. Specifically, the pads arranged in a regular pattern in the entire layout can facilitate manufacturing the semiconductor integrated circuit device, and reduce process-induced variations, thus improving the yield.

In the embodiments described above, the standard cell 101 constitutes the buffer circuit, and the standard cell 102 constitutes the two-input NOR circuit. However, the standard cell 101 and the standard cell 102 may constitute other circuits.

Moreover, the standard cells 101 and 102 may be disposed adjacent to each other in the X direction, or may be disposed in different cell rows.

Figure 13:
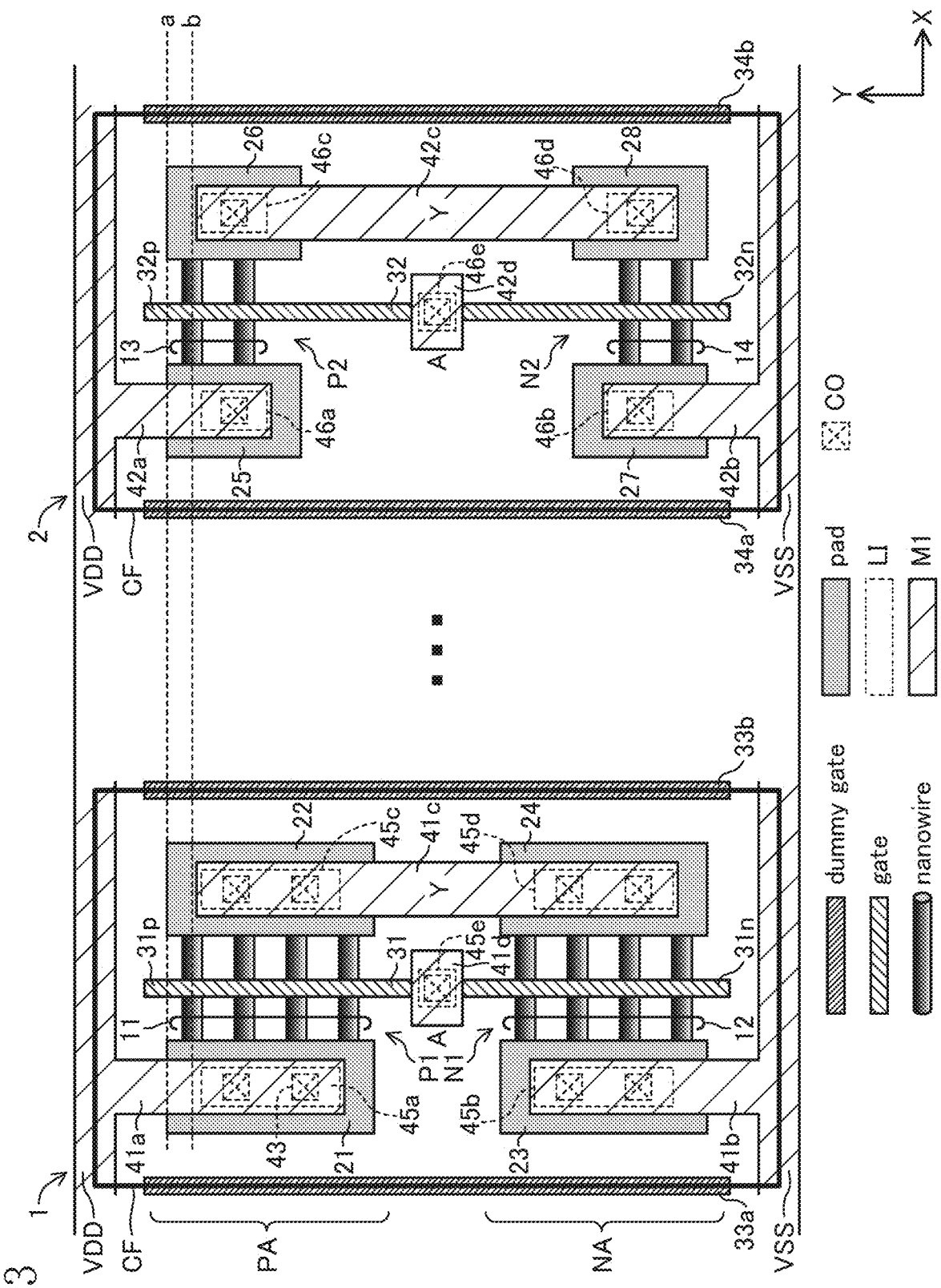
FIG. 13 illustrates a modification of the example of the layout configuration in FIG. 1.

In the foregoing description, in each nanowire FET, the pad is divided into separate parts corresponding to the associated nanowires arranged in the Y direction. However, the pad may be integral with respect to the nanowires arranged in the Y direction. FIG. 13 illustrates a variation of the example of the layout configuration in FIG. 1. In FIG. 13, the pads 21 and 22 are each integral with respect to the four nanowires 11 arranged in the Y direction, and the pads 23 and 24 are each integral with respect to the four nanowires 12 arranged in the Y direction. The pads 25 and 26 are integral with respect to the two nanowires 13 arranged in the Y direction, and the pads 27 and 28 are integral with respect to the two nanowires 14 arranged in the Y direction.

In the layout configuration illustrated in the present disclosure, the interval between the illustrated nanowires in the Y direction and the thickness of the illustrated nanowires are uniform. However, the interval and the thickness do not have to be uniform. Moreover, the number of the nanowires of each nanowire FET illustrated in the present disclosure is merely an example, and should not be limited to the number indicated in this example.

The present disclosure provides a layout configuration that helps facilitate manufacturing a semiconductor integrated circuit device including a nanowire FET, and is thus useful for improving the performance of the semiconductor integrated circuit device.

The invention claimed is:

1. A semiconductor integrated circuit device, comprising:
a standard cell including a first nanowire field effect transistor (FET) and a second nanowire FET; wherein
the first nanowire FET includes:
Na (where Na is an integer of 2 or more) first nanowires extending in a first direction,
a pair of first pads each provided on an associated one of both ends of the first nanowires in the first direction, and connected to the first nanowires, and
a first gate electrode extending in a second direction perpendicular to the first direction, and surrounding a periphery of the first nanowires within a predetermined range of the first nanowires in the first direction;
the second nanowire FET includes:
Nb (where Nb is an integer of 1 or more and less than Na) second nanowires extending in the first direction,
a pair of second pads each provided on an associated one of both ends of the second nanowires in the first direction, and connected to the second nanowires, and
a second gate electrode extending in the second direction, and surrounding a periphery of the second nanowires within a predetermined range of the second nanowires in the first direction; and
at least one of both ends, in the second direction, of the pair of first pads of the first nanowire FET is aligned in the first direction with an associated one of both ends, in the second direction, of the pair of second pads of the second nanowire FET.

2. The semiconductor integrated circuit device of claim 1, wherein
the standard cell includes a common pad that is one of the pair of first pads of the first nanowire FET and one of the pair of second pads of the second nanowire FET, and another one of the pair of first pads, the common pad, and another one of the pair of second pads are arranged at a same position and in a same range in the second direction.

3. The semiconductor integrated circuit device of claim 2, wherein among nanowire FETs included in the standard cell, the second nanowire FET is closest to one of both ends of the standard cell in the first direction.

4. The semiconductor integrated circuit device of claim 1, wherein the first and second nanowire FETs are both P-type nanowire FETs.

5. The semiconductor integrated circuit device of claim 1, wherein the first and second nanowire FETs are both N-type nanowire FETs.

* * * * *